(12) United States Patent
Nakamura et al.

(10) Patent No.: US 8,982,600 B2
(45) Date of Patent: Mar. 17, 2015

(54) MAGNETIC MEMORY INCLUDING MAGNETIC NANOWIRE AND WRITE METHOD THEREIN

(71) Applicant: Kabushiki Kaisha Toshiba, Minato-ku (JP)

(72) Inventors: Shiho Nakamura, Fujisawa (JP);
Tsuyoshi Kondo, Kawasaki (JP);
Hirofumi Morise, Yokohama (JP);
Takuya Shimada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/044,089

(22) Filed: Oct. 2, 2013

(65) Prior Publication Data
US 2014/0119111 A1    May 1, 2014

(30) Foreign Application Priority Data

Oct. 25, 2012 (JP) ................................. 2012-235988

(51) Int. Cl.
*G11C 19/00* (2006.01)
*H01L 43/02* (2006.01)
*G11C 11/16* (2006.01)
*H01L 43/08* (2006.01)
(Continued)

(52) U.S. Cl.
CPC ............ *H01L 43/02* (2013.01); *G11C 11/1675* (2013.01); *H01L 43/08* (2013.01); *H01L 27/222* (2013.01); *B82Y 99/00* (2013.01); *Y10S 977/933* (2013.01); *Y10S 977/935* (2013.01)
USPC ............ 365/81; 365/148; 365/158; 365/171; 365/173; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
See application file for complete search history.

(56) References Cited

U.S. PATENT DOCUMENTS

| 6,834,005 | B1 | 12/2004 | Parkin |
| 6,898,132 | B2 | 5/2005 | Parkin |
| 7,477,539 | B2 | 1/2009 | Kim et al. |

(Continued)

OTHER PUBLICATIONS

A.Yamaguchi et al. "Real-Space Observation of Current-Driven Domain Wall Motion in Submicron Magnetic Wires", Physical Review Letters, vol. 92, No. 7, 2004, 4 Pages.

*Primary Examiner* — Harry W Byrne
(74) *Attorney, Agent, or Firm* — Oblon, McClelland, Maier & Neustadt, L.L.P.

(57) ABSTRACT

A magnetic memory according to an embodiment includes: a magnetic nanowire; a first electrode and a second electrode provided to different locations of the magnetic nanowire; a third electrode including a magnetic layer, the third electrode being provided to a location of the magnetic nanowire between the first electrode and the second electrode; an intermediate layer provided between the magnetic nanowire and the third electrode, the intermediate layer being in contact with the magnetic nanowire and the third electrode; a fourth electrode of a nonmagnetic material provided onto the magnetic nanowire and being on the opposite side of the magnetic wire from the third electrode; and an insulating layer provided between the magnetic nanowire and the fourth electrode, the insulating layer being in contact with the magnetic nanowire and the fourth electrode.

22 Claims, 20 Drawing Sheets

(51) Int. Cl.
*H01L 27/22* (2006.01)
*B82Y 99/00* (2011.01)

(56) References Cited

U.S. PATENT DOCUMENTS

| 7,817,461 | B2 | 10/2010 | Lee et al. |
| 7,924,593 | B2 | 4/2011 | Lee et al. |
| 8,144,503 | B2 | 3/2012 | Lee et al. |
| 2009/0296454 | A1* | 12/2009 | Honda et al. ............... 365/158 |
| 2010/0193889 | A1* | 8/2010 | Nagahara et al. ........... 257/421 |
| 2010/0193890 | A1* | 8/2010 | Suzuki et al. ............... 257/421 |
| 2011/0260273 | A1* | 10/2011 | Fukami et al. .............. 257/421 |
| 2012/0206959 | A1* | 8/2012 | Honda et al. ............... 365/171 |
| 2014/0241030 | A1* | 8/2014 | Fukuzumi et al. ............ 365/80 |

\* cited by examiner (a) PRESENT EMBODIMENT (b) COMPARATIVE EXAMPLE

MAGNETIC MEMORY INCLUDING MAGNETIC NANOWIRE AND WRITE METHOD THEREIN

CROSS REFERENCE TO RELATED APPLICATIONS

This application is based upon and claims the benefit of priority from the prior Japanese Patent Application No. 2012-235988, filed on Oct. 25, 2012, the entire contents of which are incorporated herein by reference.

FIELD

Embodiments described herein relate generally to a magnetic memory including a magnetic nanowire and a write method therein.

BACKGROUND

In recent years, it has been reported that current drive of a magnetic domain wall is observed in a magnetic nanowire with a submicron width. Some magnetic memories have been proposed, which are capable of shifting magnetic domain walls using this effect. In such proposals, a magnetic nanowire which is divided into a plurality of magnetic domains is used, and information of "0" or "1" is stored by means of the direction of magnetization in each magnetic domain. Furthermore, magnetic information (data) is moved by flowing a current through the magnetic nanowire, and read by a fixed sensor. As the capacity of such a magnetic memory is increasing due to the densification of cells etc., a demand for reducing power consumption is increasing.

In such magnetic-domain-wall shifting type memories, if magnetization switching caused by spin transfer torque is used in a bit write operation, a low-power-consumption driving can be achieved, which consumes a lower power as compared to the write operation using a magnetic field caused by a current. In addition, it becomes possible to prevent erroneous writing to adjacent magnetic nanowires, and to define the portion on which the writing has been performed.

However, the writing by spin transfer torque still requires a high write current.

DETAILED DESCRIPTION

A magnetic memory according to an embodiment includes: a magnetic nanowire; a first electrode and a second electrode provided to different locations of the magnetic nanowire; a third electrode including a magnetic layer, the third electrode being provided to a location of the magnetic nanowire between the first electrode and the second electrode; an intermediate layer provided between the magnetic nanowire and the third electrode, the intermediate layer being in contact with the magnetic nanowire and the third electrode; a fourth electrode of a nonmagnetic material provided onto the magnetic nanowire and being on the opposite side of the magnetic nanowire from the third electrode; and an insulating layer provided between the magnetic nanowire and the fourth electrode, the insulating layer being in contact with the magnetic nanowire and the fourth electrode.

Embodiments will now be explained in detail with reference to the accompanying drawings.

First Embodiment

Figure 1:
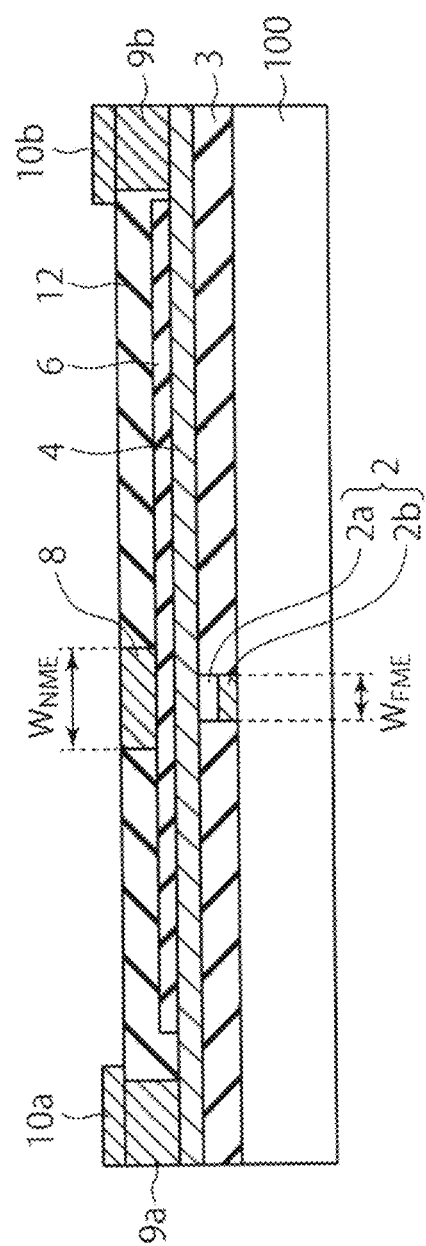
FIG. 1 is a cross-sectional view showing a magnetic memory according to a first embodiment.

FIG. 1 is a cross-sectional view of the magnetic memory according to a first embodiment. As shown in FIG. 1, the magnetic memory according to this embodiment includes a magnetic nanowire 4 serving as a storage element, which is arranged above a substrate 100 on which an integrated circuit (not shown in FIG. 1) is formed, an electrode 2 including an intermediate layer 2a and a magnetic electrode layer 2b, an electrode 8, and electrodes 10a, 10b.

The electrode 2 is arranged on a first surface of the magnetic nanowire 4. The intermediate layer 2a is arranged between the first surface and the magnetic electrode layer 2b. An interlayer insulating film 3 is arranged between the substrate 100 and the magnetic nanowire 4. The electrode 8 is arranged on a second surface that is opposite to the first surface of the magnetic nanowire 4 with an insulating layer 6 being sandwiched between the electrode 8 and the magnetic nanowire 4, in a location corresponding to the electrode 2.

The electrode 8 is formed of a nonmagnetic metal. Electrodes 10a, 10b are arranged above the first surface or second surface of the magnetic nanowire 4 and connected to the magnetic nanowire 4 by vias 9a, 9b. The electrode 2 and the electrode 8 are arranged between the electrodes 10a, 10b. An interlayer insulating film 12 is arranged between the electrode 8 and the electrode 10a, and between the electrode 8 and the electrode 10b.

The widths of the magnetic electrode layer 2a and the electrode 8 in the direction along which the magnetic nanowire 4 extends are determined in such a manner that the width $W_{NME}$ of the electrode 8 in the direction along which the magnetic nanowire extends on the plane where the electrode 8 is in contact with the insulating layer 6 is equal to or more than the width $W_{FME}$ of the magnetic electrode layer 2b in the direction along which the magnetic nanowire 4 extends on the plane where the magnetic electrode layer 2b is in contact with the intermediate layer 2a. It is desirable that the width $W_{NME}$ be less than 400 nm. Herein, the direction along which the magnetic nanowire 4 extends means the direction along which a local portion of the magnetic nanowire 4 extends around the electrode 2.

Figure 2:
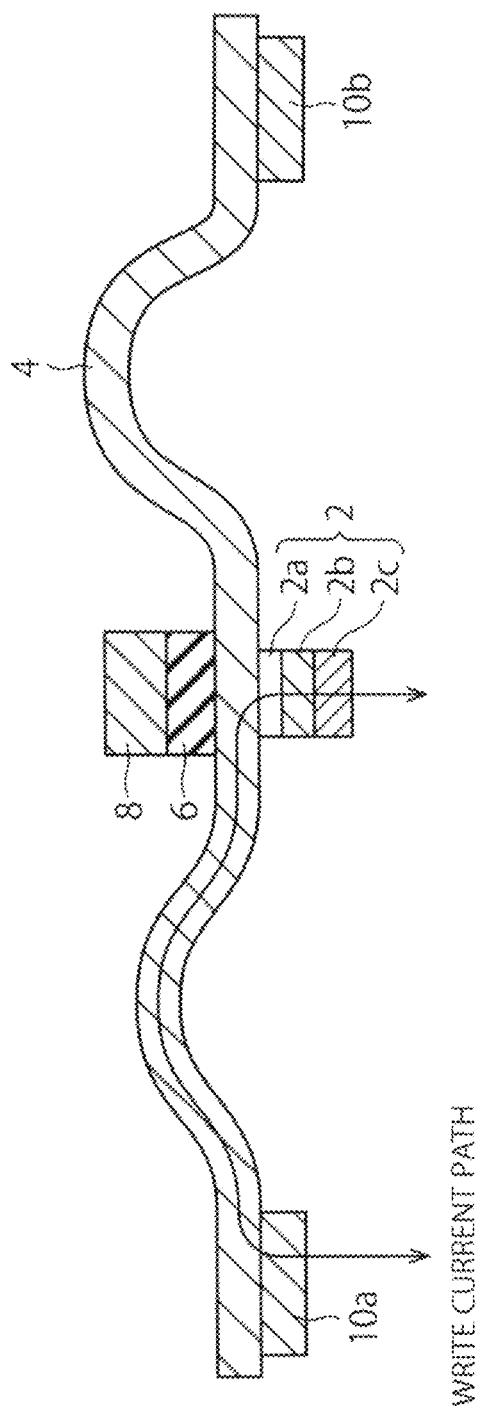
FIG. 2 is a cross-sectional view showing a magnetic memory according to a modification of the first embodiment.

The magnetic nanowire 4 can be either a straight line or curved line as shown in FIG. 2. In FIG. 2, the electrode 2 also includes an electrode 2c, which is nonmagnetic and provided onto a surface of the magnetic electrode layer 2b opposite to the surface on which the intermediate layer 2a is present. In FIG. 1, this electrode 2c is in the substrate 100, and cannot be seen. As will be described later, the external shape of the magnetic nanowire 4 can have constrictions appearing at regular intervals. It is desirable that the first surface of the magnetic nanowire 4 be determined by the direction along which the magnetic nanowire 4 extends and the longitudinal direction in the section of the magnetic nanowire 4 perpendicular to the direction along which the magnetic nanowire 4 extends. For example, in a case where the section of the magnetic nanowire 4 is rectangular, and the thickness of the magnetic nanowire 4 is less than the width thereof, the upper surface and the lower surface of the magnetic nanowire 4 serves as the first surface and the second surface, and in a case where the thickness of the magnetic nanowire 4 is greater than the width thereof, the two side surfaces of the magnetic nanowire 4 serve as the first surface and the second surface. Although the first surface is below the magnetic nanowire 4 and the second surface is above the magnetic nanowire 4 in FIGS. 1 and 2, the same effect can be obtained if the locations are reversed.

The section of the magnetic nanowire 4 is, for example, rectangular, square, oval, or circular. It is desirable that the width of the magnetic nanowire 4 be approximately from 5 nm to a few hundreds nm, and the thickness thereof is from a few nm to 100 nm. Although the thickness (in FIGS. 1 and 2, the distance between the upper surface and the lower surface) of the magnetic nanowire 4 is constant in FIGS. 1 and 2, it can change at regular intervals. As will be shown in FIGS. 6(a) and 6(b) later, the width can also change at regular intervals. Furthermore, notches can be formed at regular intervals.

A plurality of magnetic domains and a plurality of magnetic domain walls for partitioning the magnetic domains are introduced into the magnetic nanowire 4. Information is recorded by setting the direction of the magnetic moment of a magnetic domain so as to correspond to "1" or "0" of data. The magnetization of the magnetic nanowire 4 has an axis of easy magnetization in the direction perpendicular to the direction along which the magnetic nanowire 4 extends.

A perpendicular magnetization film formed of a rare earth-transition metal amorphous alloy, a multi-layer film, an ordered alloy containing a transition metal and Pt or Pd can be used to form the magnetic nanowire 4. A rare earth-transition metal amorphous alloy is a ferrimagnetic material containing an alloy of a rare earth transition metal and a 3d-transition metal. For example, a rare earth-transition metal amorphous alloy contains at least one element selected from the group consisting of Tb (terbium), Dy (dysprosium), and Gd (gadolinium) and at least one of transition metals. Specific examples are TbFe, TbCo, TbFeCo, DyTbFeCo, GdTbCo, GdFeCo, and so on. A Co/Ni multi-layer film, a Co/Pd multi-layer film, a Co/Pt multi-layer film, and so on can be used to form the multi-layer film. An alloy containing at least one element selected from the group consisting of Fe, Co, and Ni, and at least one element selected from the group consisting of Pt and Pd is suitable to form the ordered alloy. Examples of an ordered alloy having the crystal structure of $L_{10}$ type are $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, $Co_{30}Ni_{20}Pt_{50}$, and so on. The composition ratio of the ordered alloy is not limited to the foregoing. It is possible to add an impurity element such as Cu, Cr, and Ag to the ordered alloy to adjust the magnetic anisotropy energy and the saturation magnetization. It is possible to obtain large magnetic anisotropy energy easily.

Furthermore, by using a material having a high anisotropy to form the magnetic nanowire 4, it is possible to provide an axis of easy magnetization in the width direction of the magnetic nanowire 4, as will be described later with reference to FIG. 3(b). For example, by aligning the c-axis of Co crystal in the width direction of the magnetic nanowire 4, it is possible to direct the magnetization toward the width direction of the magnetic nanowire 4, which is perpendicular to the direction along which the magnetic nanowire 4 extends.

Incidentally, if the magnetic nanowire 4 includes a layer of at least one of the aforementioned materials, i.e., if a combination of materials such as TbFeCo/CoFeB, GdFeCo/Ru/TbFeCo, and TbFeCo/CoFeB/Ru/CoFeB is used, it is possible to adjust the magnetic domain wall characteristic of the magnetic nanowire 4.

(Write Operation)

The write operation is performed on the magnetic nanowire 4 using the electrode 2 and the electrode 8. This will be explained with reference to FIGS. 3(a) to 3(d). FIGS. 3(a) and 3(b) are cross-sectional views showing a case where the magnetic nanowire 4 has an axis of easy magnetization in the thickness direction, and FIGS. 3(c) and 3(d) are cross-sectional views showing a case where the magnetic nanowire 4 has an axis of easy magnetization in the width direction.

The write operation is performed by causing a write current to flow between the magnetic electrode layer 2b and the magnetic nanowire 4 while a voltage is applied between the electrode 8 and the magnetic nanowire 4. Data to be written to a cell TC-w of the magnetic nanowire 4 is defined by changing the direction of the write current as shown in FIGS. 3(a) to 3(d). For example, in a case where the write operation is performed to change the direction of magnetization of the cell TC-w of the magnetic nanowire 4 from the state that is antiparallel to the fixed direction of magnetization of the magnetic electrode layer 2b to the state that is parallel thereto, an electron current (that flows in the direction opposite to the direction of current) is caused to flow from the magnetic electrode layer 2b toward the cell TC-w of the magnetic nanowire 4 via the intermediate layer 2a, as shown in FIGS. 3(a) and 3(c), while a voltage is applied between the electrode 8 and the magnetic nanowire 4. At this time, the electron current is spin polarized when passing through the magnetic electrode layer 2b. This spin-polarized electron current flows into the cell TC-w of the magnetic nanowire 4 via the intermediate layer 2a. As a result, the spin transfer torque acts on the magnetization of the cell TC-w of the magnetic nanowire 4, so that the magnetization of the cell TC-w is oriented to the same direction (parallel to) that of the magnetization of the magnetic electrode layer 2b.

Figure 3:
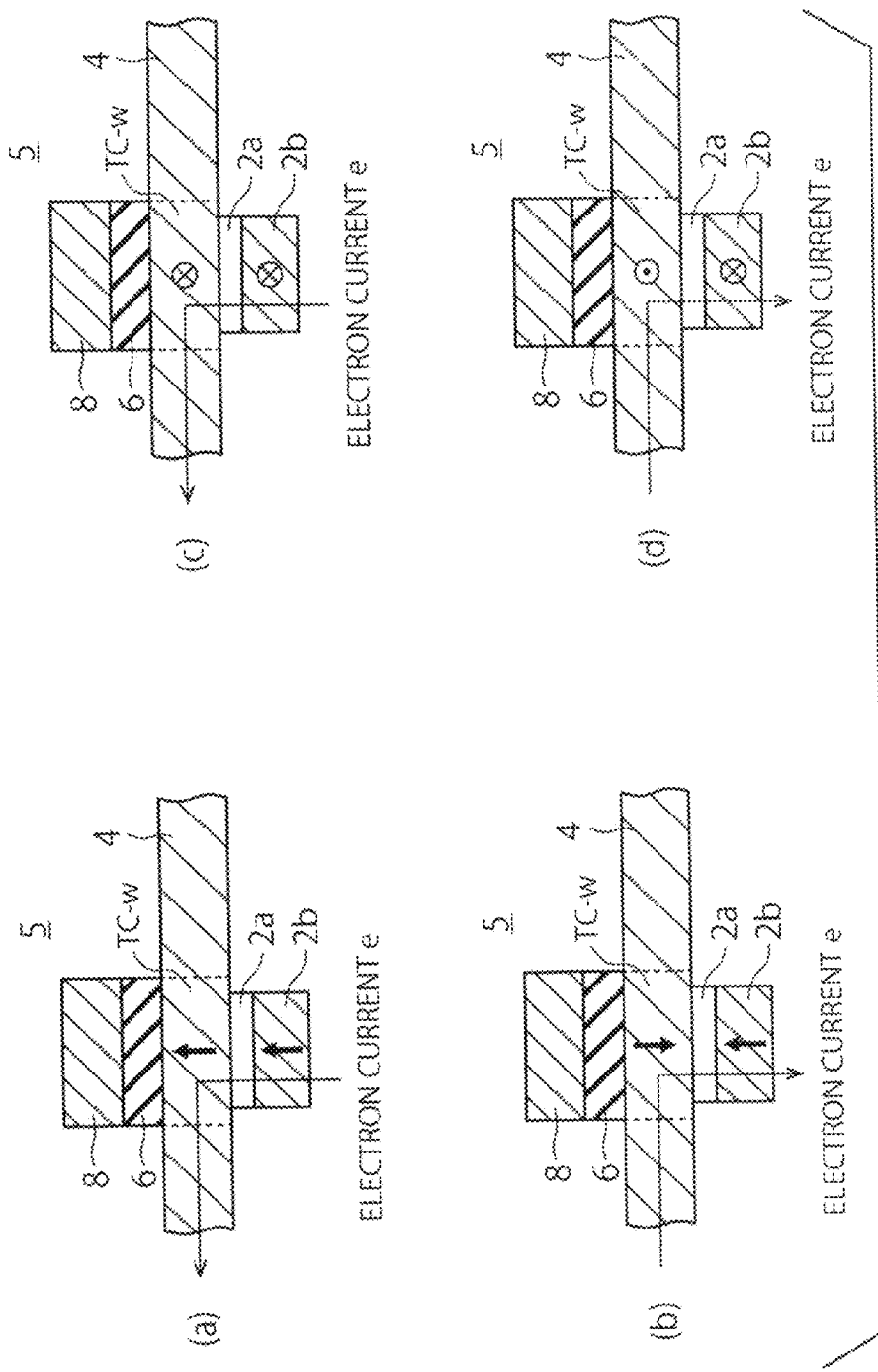
FIGS. 3(a) to 3(d) are drawings for explaining a write method.

In contrast, in a case where the write operation is performed to change the direction of magnetization of the cell TC-w of the magnetic nanowire 4 from the state that is parallel to the direction of magnetization of the magnetic electrode layer 2b to the state that is antiparallel thereto, an electron current is caused to flow from the cell TC-w of the magnetic nanowire 4 toward the magnetic electrode layer 2b via the intermediate layer 2a, as shown in FIGS. 3(b) and 3(d), while a voltage is applied between the electrode 8 and the magnetic nanowire 4. At this time, the electron current is spin polarized when passing through the cell TC-w of the magnetic nanowire 4. This spin-polarized electron current flows into the magnetic electrode layer 2b via the intermediate layer 2a. As a result, electrons spin-polarized in the direction parallel to the direction of magnetization of the magnetic electrode layer 2b pass through the magnetic electrode layer 2b, but electrons spin-polarized in the direction antiparallel to the direction of magnetization of the magnetic electrode layer 2b are reflected at the interface between the intermediate layer 2a and the magnetic electrode layer 2b. The reflected spin-polarized electrons flow through the cell TC-w of the magnetic nanowire 4, and the spin transfer torque acts on the magnetization of the cell TC-w of the magnetic nanowire 4, so that the magnetization of the cell TC-w is oriented to the direction opposite (antiparallel) to the direction of the magnetization of the magnetic electrode layer 2b.

Incidentally, even if there is an electrode 8, if the insulating layer 6 is not provided between the electrode 8 and the magnetic nanowire 4, the field effect is not produced since no voltage is applied to the magnetic nanowire. Therefore, the effect of this embodiment cannot be obtained.

Thus, in this embodiment, the electrode 2 including the intermediate layer 2a, the magnetic electrode layer 2b, and the nonmagnetic electrode 2c, the insulating layer 6, and the electrode 8 form a writing unit 5.

In order to transfer spin transfer torque, a nonmagnetic tunnel barrier material or nonmagnetic metal is used to form the intermediate layer 2a. As the nonmagnetic tunnel barrier material, such materials as aluminum oxide (AlOx), aluminum nitride (AlN), magnesium oxide (MgO), magnesium nitride, silicon oxide (SiO$_2$), silicon nitride (Si—N), silicon oxynitride (Si—O—N), TiO$_2$, Cr$_2$O$_3$, and so on can be used. Besides the above materials, a nonmagnetic material such as graphite can be used. Examples of the nonmagnetic material are Cu, Ag, Au, Al, and an alloy containing at least one of these materials.

In order to form the insulating layer 6, an insulating material such as aluminum oxide (AlOx), aluminum nitride (AlN), magnesium oxide (MgO), magnesium nitride, silicon oxide (SiO$_2$), silicon nitride (Si—N), silicon oxynitride (Si—O—N), TiO$_2$, Cr$_2$O$_3$, and so on, and a dielectric material such as barium titanate (BaTiO$_3$), SrTiO$_3$, PbTiO$_3$, HfO$_2$, and so on can be used.

Depending on the direction of magnetization of the magnetic nanowire 4, either a perpendicular magnetization film or in-plane magnetization film is used as the magnetic electrode layer 2b. In order to form the perpendicular magnetization film, a rare earth-transition metal amorphous alloy, a multilayer film, or an ordered alloy containing a transition metal and Pt or Pd as described above can be used. Alternatively, a metal or alloy containing at least one element selected from the group consisting of Fe, Co, and Ni can be used. The metal or the alloy containing at least one element selected from the group consisting of Fe, Co, and Ni can also be used to form an in-plane magnetization film. Examples of such materials are a NiFe alloy, a NiFeCo alloy, a CoFeB alloy, a CoCr alloy, a CoPt alloy, a CoCrTa alloy, a CoCrPt alloy, a CoCrPtTa alloy, a CoCrNb alloy, a CoFeB alloy, and so on. If the magnetic electrode layer 2b includes a layer of at least one of the above materials, i.e., if a combination of materials such as CoFeB/TbFeCo and CoFeB/CoFe/Ru/CoFe/IrMn is used, it is possible to adjust the magnetic characteristic of the magnetic electrode layer 2b.

The electrode 8 is formed of a nonmagnetic metal. A specific example thereof is Cu, Ag, Au, or Al, and an alloy containing at least one of such materials.

(Dimensions of Magnetic Electrode Layer 2b and Electrode 8)

Figure 4:
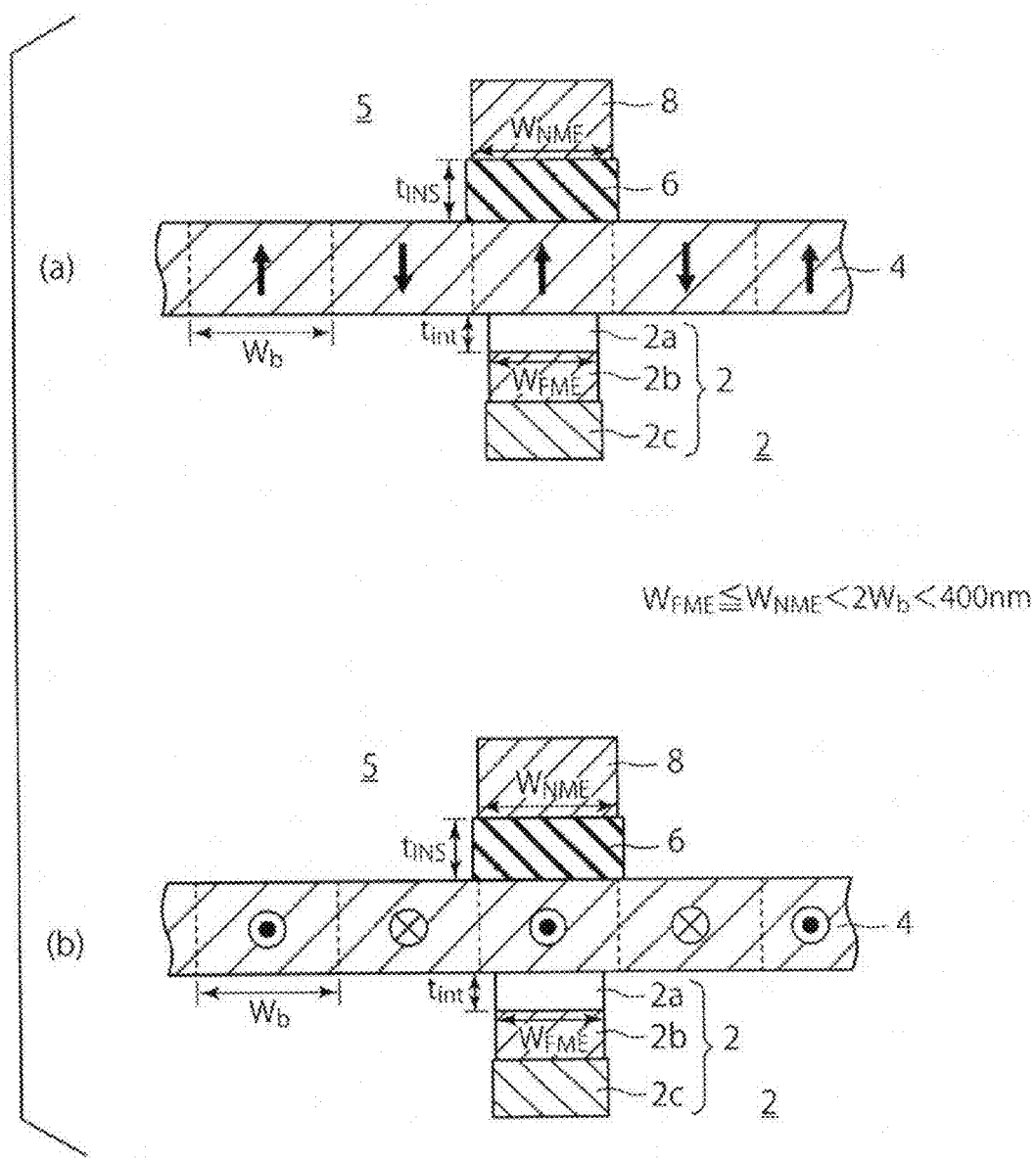
FIGS. 4(a) and 4(b) are drawings for explaining the position of the writing unit.

The dimensions of the magnetic electrode layer 2b and the electrode 8 will be described with reference to FIGS. 4(a) and 4(b). FIG. 4(a) is a cross-sectional view showing a case where the magnetic nanowire 4 has an axis of easy magnetization in the thickness direction, and FIG. 4(b) is a cross-sectional view showing a case where the magnetic nanowire 4 has an axis of easy magnetization in the width direction. As described above, the dimensions of the magnetic electrode layer 2b and the electrode 8 are determined so that the width $W_{NME}$ of the electrode 8 in the direction along which the magnetic nanowire 4 extends is equal to or more than the width $W_{FME}$ of the magnetic electrode layer 2b in the direction along which the magnetic nanowire 4 extends, and more preferably, the $W_{NME}$ of the electrode 8 is greater than the width $W_{FME}$ of the magnetic electrode layer 2b.

By setting such a range, it is possible to perform the write operation effectively. Furthermore, the width $W_{NME}$ of the electrode 8 is less than twice the length (1 bit length) Wb of the magnetic domain of the magnetic nanowire 4 in the direction along which the magnetic nanowire 4 extends. If the width $W_{NME}$ of the electrode 8 is equal to or more than twice the length (1 bit length) Wb of the magnetic domain, erroneous writing to an adjacent cell is caused. It is preferable that the width $W_{NME}$ of the electrode 8 is less than 400 nm. If the width $W_{NME}$ is equal to or more than 400 nm, it becomes difficult to increase the density of the memory.

If the intermediate layer 2a is a nonmagnetic tunnel barrier layer, the thickness $t_{int}$ of the intermediate layer 2a is thinner than the thickness $t_{INS}$ of the insulating layer 6. If the thickness $t_{int}$ of the intermediate layer 2a is thicker than the thickness $t_{INS}$ of the insulating layer 6, it is not possible to have a sufficient write current.

Figure 5:
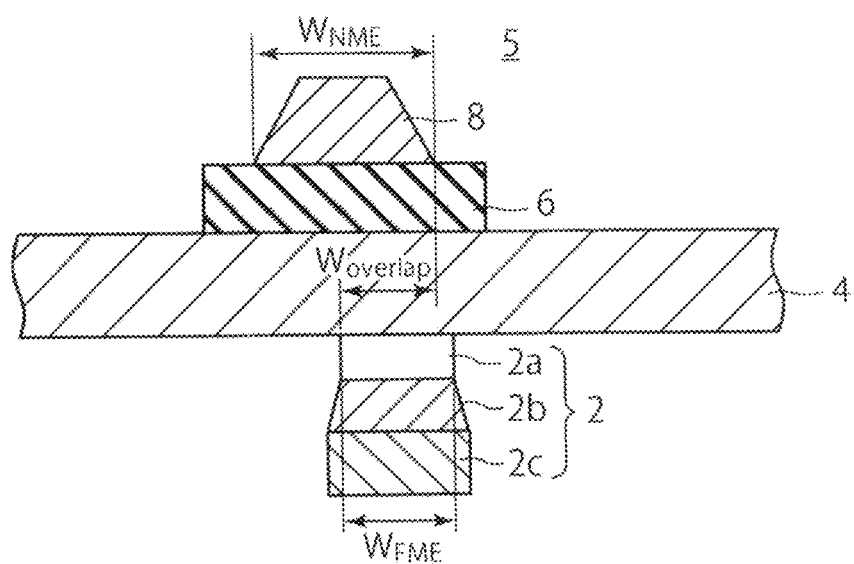
FIG. 5 is a drawing for explaining the position of the writing unit.

It is desirable that the length $W_{overlap}$ by which the plane where the electrode 8 is in contact with the insulating layer 6 overlap the plane where the magnetic electrode layer 2b is in contact with the intermediate layer 2a in the direction along which the magnetic nanowire 4 extends is equal to or more than the length of the magnetic domain wall in the direction along which the magnetic nanowire 4 extends, i.e., the width $W_{DW}$ of the magnetic domain wall, and equal to or less than the width $W_{FME}$ of the magnetic electrode layer 2b, as shown in FIG. 5. If the length $W_{overlap}$ is shorter than the width $W_{DW}$ of the magnetic domain wall, it is not possible to perform the write operation effectively. The width $W_{DW}$ of the magnetic domain wall can be obtained from the equation $W_{DW} = (A/Ku)^{1/2}$ where A is the exchange stiffness constant of the material, and Ku is the magnitude of magnetic anisotropy. Furthermore, the width $W_{DW}$ of the magnetic domain wall can be obtained from the micromagnetic simulation. Moreover, the width $W_{DW}$ of the magnetic domain wall can be obtained directly by means of magnetic domain observing means such as a magnetic force microscope (MFM), a spin scanning electron microscope (SEM), a spin scanning tunneling microscope (STM), and so on.

Figure 6:
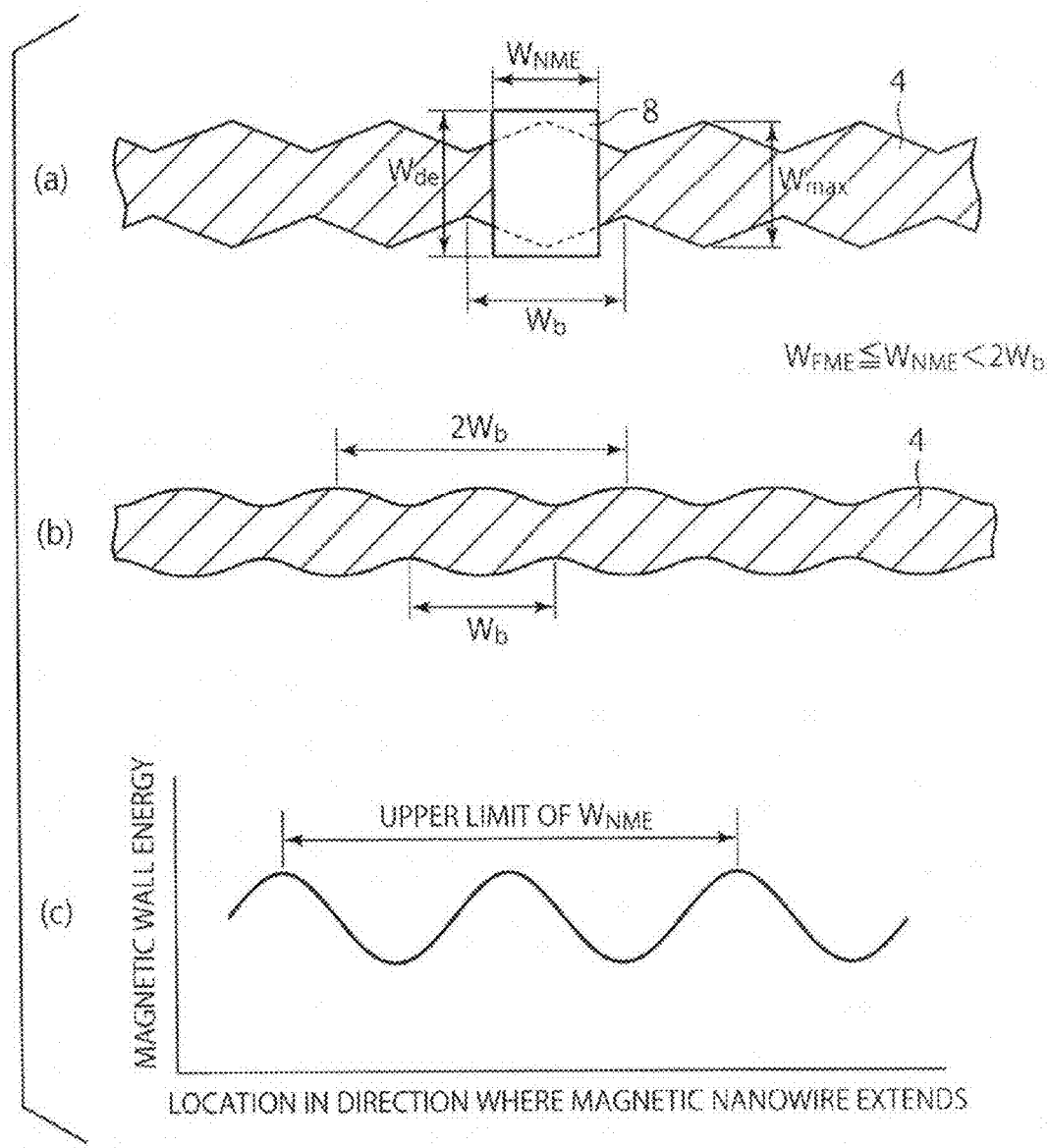
FIGS. 6(a) to 6(c) are drawings for explaining a magnetic nanowire having constrictions.

Next, the case where the magnetic nanowire has a shape that changes at regular intervals in accordance with the length of a recording bit will be described with reference to FIGS. 6(a) to 6(c). FIGS. 6(a) and 6(b) are top views showing an example in which constrictions are provided to the magnetic nanowire 4. FIG. 6(c) is a graph showing the dependence of the magnetic domain wall energy on the position in the nanowire direction of the magnetic nanowire 4. In these magnetic nanowires 4, constrictions appear at regular intervals. As a result, the magnetic domain wall energy changes periodically. The potential of the magnetic domain wall becomes lower in each constriction portion, so that the magnetic domain wall can be stably present therein. Therefore, the length corresponding to a regular interval of the constrictions becomes a minimum length of the recording bit. It is desirable that the width $W_{NME}$ of the electrode 8 be less than twice the length $W_b$ of the recording bit. Alternatively, it is desirable that width $W_{NME}$ of the electrode 8 be less than twice the cycle of the potential of the magnetic domain wall. When the width $W_{NME}$ is equal to or greater than twice the cycle of the potential of the magnetic domain wall, an erroneous writing to an adjacent cell is caused. On the other hand, it is desirable that the width $W_{FME}$ of the magnetic electrode layer 2b be less than the length $W_b$ of the recording bit. Alternatively, it is desirable that the width $W_{FME}$ of the magnetic electrode layer 2b be less than the cycle of the potential of the magnetic domain wall. In this manner, it is possible to perform a write operation reliably with the write current being controlled to be low. Furthermore, it is desirable that the width $W_{de}$ of the electrode 8 in the direction perpendicular to the direction along which the magnetic nanowire 4 extends be greater than a maximum nanowire width $W_{max}$ that is the widest in the portion of the magnetic nanowire 4, which face the electrode 8 via the insulating layer 6, so as to effectively reduce the current. It is desirable that the width $W_{FME}$ of the magnetic electrode layer 2b be equal to or more than the width $W_{DW}$ of the magnetic domain wall and equal to or less than the width $W_{NME}$ for a reliable write operation.

With respect to the overlap relationship between the plane where the electrode 8 is in contact with the insulating layer 6 and the plane where the magnetic electrode layer 2b is in contact with the intermediate layer 2a in the direction along which the magnetic nanowire extends, it is desirable that the former completely overlap the latter. That is, it is preferable that when the plane where the electrode 8 is in contact with the insulating layer 6 is projected from the direction perpendicular to the direction along which the magnetic nanowire 4 extends, the above plane includes the plane where the magnetic electrode layer 2b is in contact with the intermediate layer 2a. However, as described above, it is desirable that the allowable range of the length $W_{overlap}$ be equal to or more than the width $W_{DW}$ of the magnetic domain wall, and equal to or less than the width $W_{FME}$ of the magnetic electrode layer 2b. Furthermore, it is desirable that the plane where the magnetic electrode layer 2b and the intermediate layer 2a are in contact with each other cover a peak of the potential of magnetic domain wall in the corresponding magnetic nanowire 4. It is also desirable that the plane where the electrode 8 and the insulating layer 6 are in contact with each other be in a range extending from a peak to the third peak counted from this peak of the potential of magnetic domain wall of the corresponding magnetic nanowire 4. FIG. 6(a) shows the state where the plane where the electrode 8 and the insulating layer 6 are in contact with each other covers a projection (a partially wide portion of the magnetic nanowire 4), i.e., a peak of the potential of magnetic domain wall. In this manner, it is possible to perform a write operation at a predetermined position with the write current being controlled. Incidentally, in a magnetic nanowire 4 having constrictions, a peak of the potential of magnetic domain wall corresponds to a portion where the nanowire is wide (projection).

The case where one projection corresponds to one bit in a magnetic nanowire having a cyclic structure has been described. If two projections correspond to one bit, the desirable upper limit value of the cycle of the potential cycle of the width $W_{NME}$ of the electrode 8 and the width $W_{FME}$ of the magnetic electrode layer 2b changes. It is desirable that the width $W_{NME}$ of the electrode 8 be less than three times the cycle of the potential of magnetic domain wall, and the width $W_{FME}$ of the magnetic electrode layer 2b be less than two times the cycle of the potential of magnetic domain wall. If the width $W_{NME}$ is equal to or more than three times the cycle of the potential of magnetic domain wall, an erroneous writing to an adjacent cell is caused. Furthermore, it is desirable that the plane where the magnetic electrode layer 2b and the intermediate layer 2a are in contact with each other cover two peaks of the potential of magnetic domain wall of the corresponding magnetic nanowire 4, and the plane where the electrode 8 and the insulating layer 6 are in contact with each other cover a range from a peak and the fourth peak counted from this peak of the potential of magnetic domain wall of the corresponding magnetic nanowire 4.

In the write operation described with reference to FIGS. 4(a) and 4(b), when an electric field is applied to the magnetic nanowire 4 via the insulating layer 6, the magnetic properties such as the magnitude of magnetic anisotropy, the direction of magnetic anisotropy, the magnitude of magnetization, and so on in the portion of the magnetic nanowire 4 where the electric field is applied change. As a result, for example, a write current required in magnetization switching can be reduced in a magnetic nanowire having a perpendicular magnetization by decreasing perpendicular magnetic anisotropy.

The timings in a write operation will be described with reference to FIGS. 7 to 9.

Figure 7:
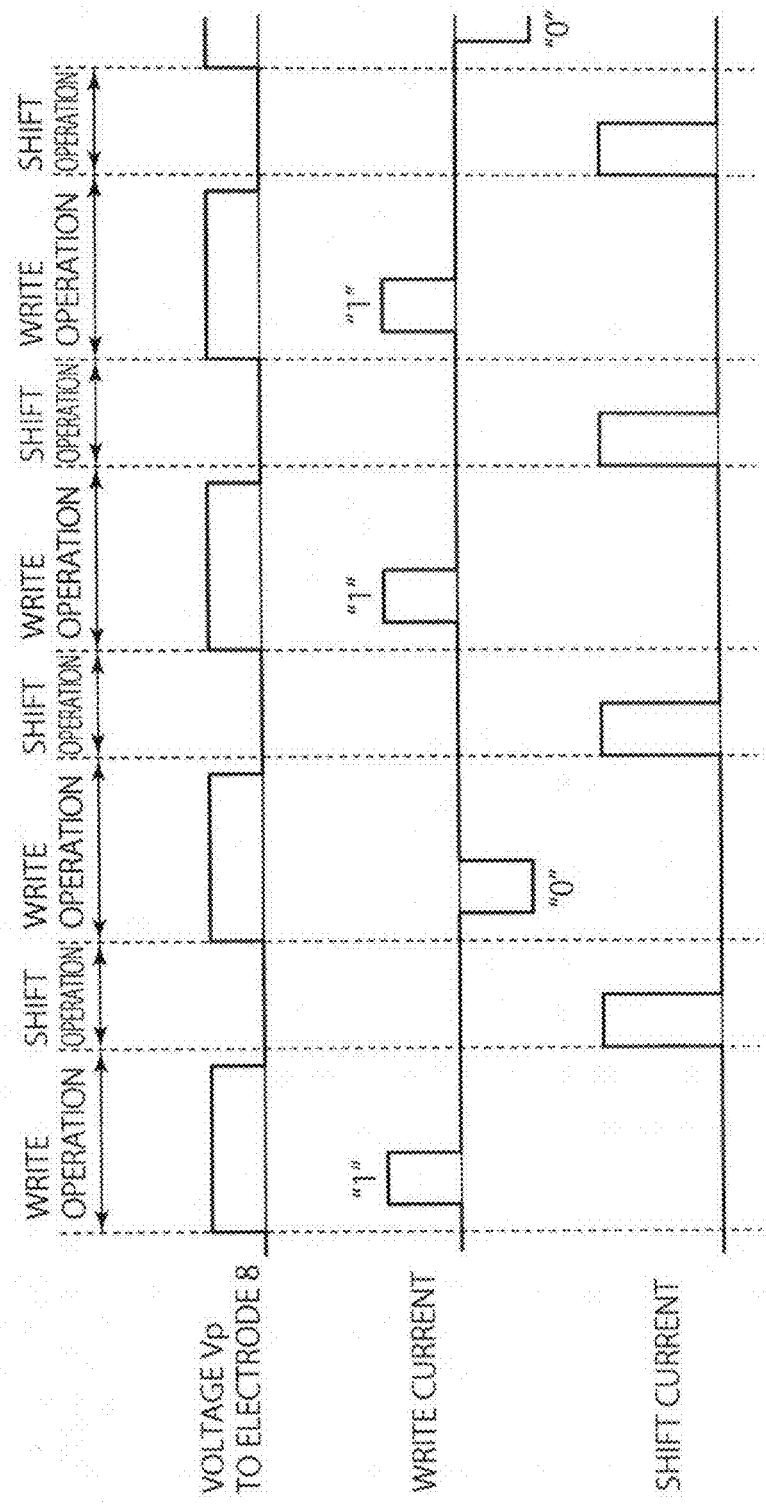
FIG. 7 shows waveforms of a first example of the write operation.
Figure 8:
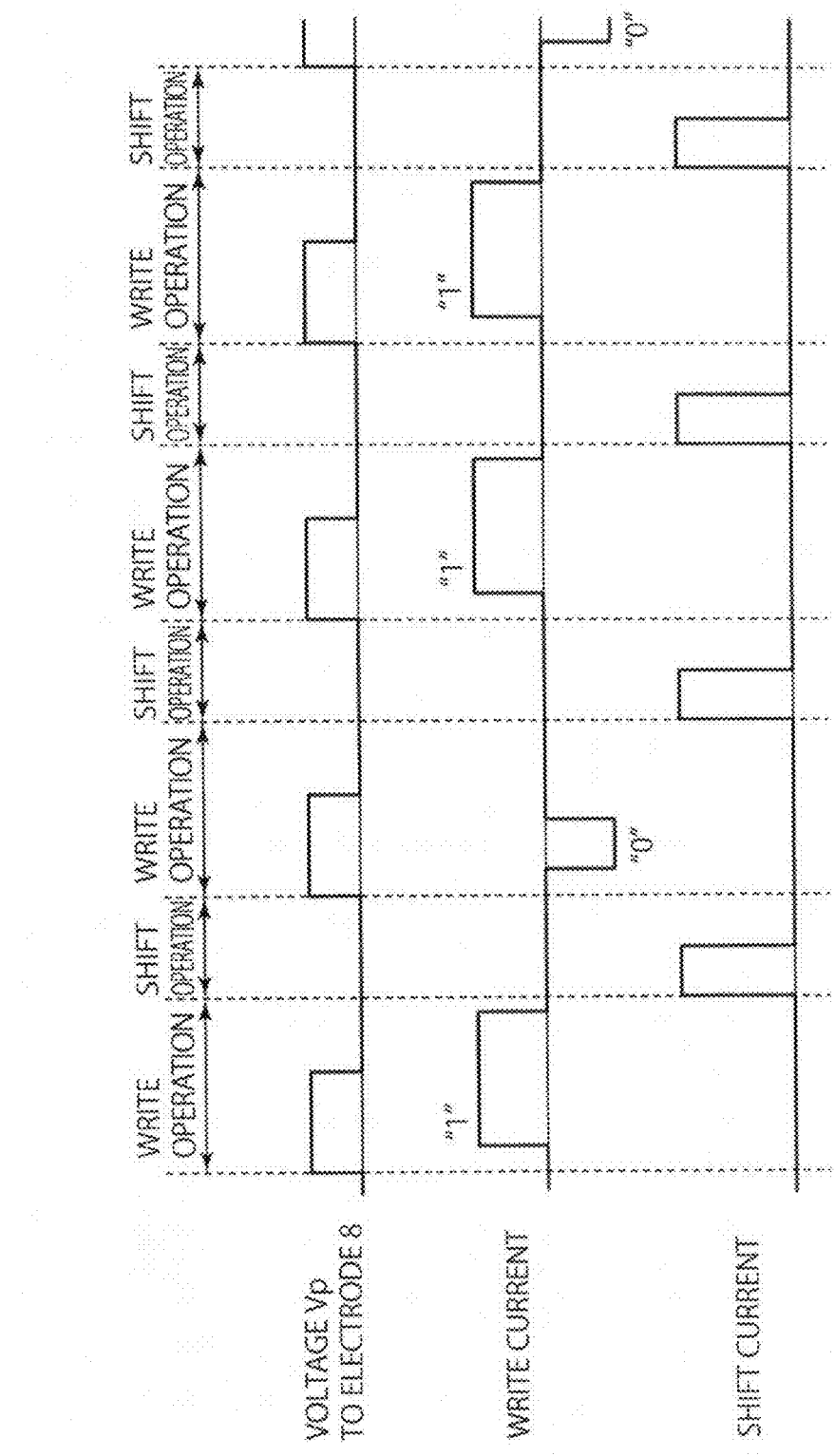
FIG. 8 shows waveforms of a second example of the write operation.

FIG. 7 shows waveforms indicating the operation timings of the voltage applied to the electrode 8 and the spin transfer torque current flowing through the magnetic electrode layer 2b. In the write operation, a electric field is applied to the magnetic nanowire 4 by applying a voltage Vp to the electrode 8, and in the state where the electric field is applied, current pulses (write current) are caused to flow from the magnetic electrode layer 2b to the magnetic nanowire 4 using the electrode 10a or electrode 10b so that a spin transfer torque is applied onto the magnetic nanowire 4. The direction of magnetization (magnetic information) to be written is determined by the polarity of the current pulses. For example, the magnetization information written when the write current is positive is "1," and the magnetization information written when write current is negative is "0."

It is desirable that the current pulses flow until the magnetization switching region grows to a size of a half of the recording bit. Furthermore, for example, in the magnetic nanowire 4 having constrictions shown in FIGS. 6(a) and 6(b), it is desirable that the current pulses flow until the magnetization switching region grows to a size by which it is possible to cover a peak of the potential of magnetic domain wall. A peak of the potential of magnetic domain wall corresponds to a partially wide portion of the magnetic nanowire 4. Thereafter, the current pulses and the voltage are turned off, and then the magnetic domain wall is relaxed to a stable point. In the first example shown in FIG. 7, the write current is caused to flow while a voltage Vp is applied to the electrode 8. That is, the write current becomes 0 before the voltage Vp applied to the electrode 8 becomes 0. The polarity of the voltage Vp applied to the electrode 8 is determined in a manner that when a voltage is applied to the electrode 8, if electrons are accumulated at the electrode 8 side, this direction is a positive direction. If there is a strong field effect, the write current is caused to flow after the voltage Vp is applied to the electrode 8, and becomes 0 after the voltage Vp becomes 0 as in the second example shown in FIG. 8. That is, a stable write operation is intended by first causing the voltage Vp to be 0. In the third example shown in FIG. 9, the write current and the voltage Vp are simultaneously applied, thereby simplifying the operation.

After the magnetic information (bit data) is written to the magnetic nanowire 4, the written data (magnetic information) is shifted by 1 bit to an adjacent cell. The shift operation is performed by causing a current to flow between the electrode 10a and the electrode 10b. After the bit data is shifted, the write operation and the shift operation for shifting the bit data are performed again. In this manner, a bit sequence is recorded in the magnetic nanowire 4. Although the rising and the falling of the pulses in the waveforms shown in FIGS. 7 to 9 are steep, they may be gradual depending on the circuit design.

Next, a relationship between the electrode for the shift operation and the electrode for causing a spin transfer torque current to flow will be described below. In FIG. 1, the electrode 10a is used in both the spin transfer torque write operation and the shift operation. Specifically, in the write operation, while a current is caused to flow between the electrode 10a and the electrode 2, a voltage is applied to the electrode 8, and in the shift operation, a current is caused to flow between the electrode 10a and the electrode 10b. Incidentally, the same effect can be obtained if the functions of the electrode 10a and the electrode 10b are reversed, i.e., instead of the electrode 10a, for example, the electrode 10b can be used in both the spin transfer torque write operation and the shift operation.

(First Modification)

Figure 10:
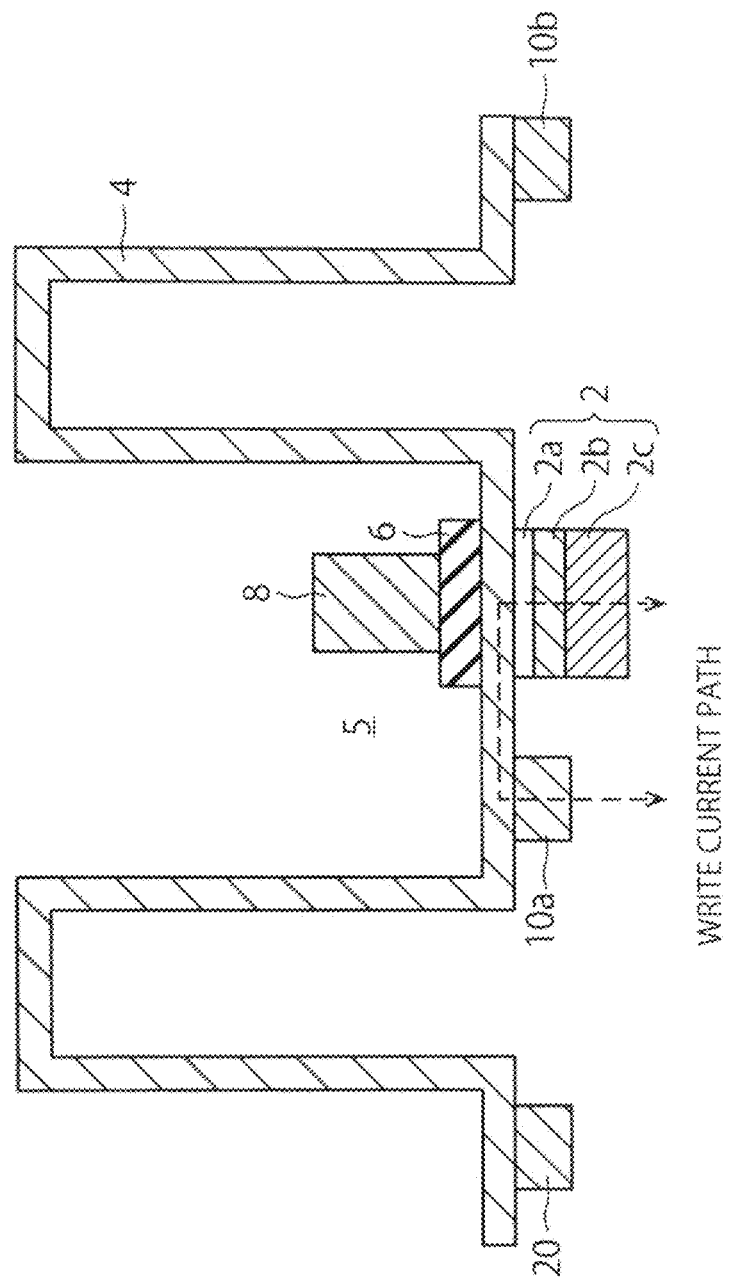
FIG. 10 is a cross-sectional view showing a magnetic memory according to a first modification of the first embodiment.

A magnetic memory according to a first modification of the first embodiment will be described with reference to FIG. 10, which is a cross-sectional view of the magnetic memory according to the first modification. In the first modification, an electrode 20 for shift operation is further provided. The electrode 20 is arranged to be more distant from the electrode 2 than the electrode 10a. The state "more distant" means that the distance on the magnetic nanowire 4 from the portion where the electrode 20 is present to the portion where the electrode 2 is present is longer than the distance on the magnetic nanowire 4 from the portion where the electrode 10a is present to the portion where the electrode 2 is present.

The magnetic nanowire 4 has a plurality of bent portions. The spin transfer torque current is caused to flow between the electrode 10a and the electrode 2, which are arranged to be close to each other, and a current to perform a shift operation is caused to flow between the electrode 20 and the electrode 10b. If the spin transfer torque current is relatively large, and may disturb the shift operation, it is preferable that the path through which the spin transfer torque current flows is shortened in such a manner.

(Second Modification)

Figure 11:
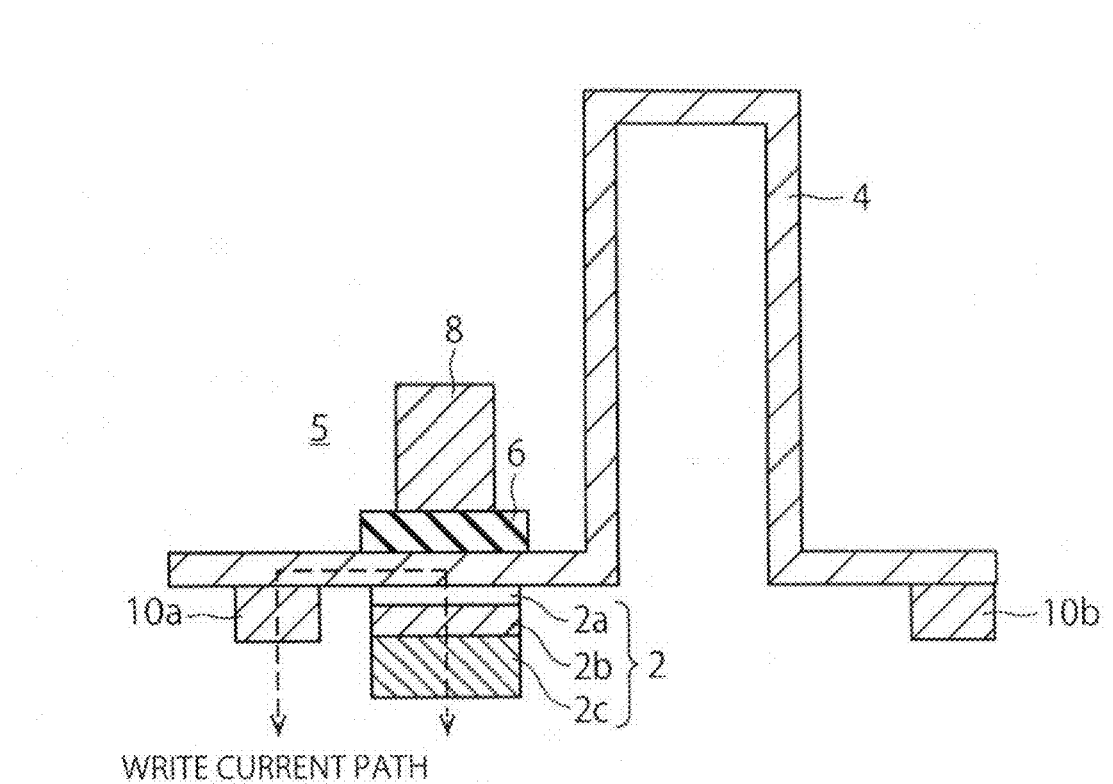
FIG. 11 is a cross-sectional view showing a magnetic memory according to a second modification of the first embodiment.

FIG. 11 shows a magnetic memory according to a second modification of the first embodiment. In the magnetic memory of the second modification, the functions of the respective electrodes are the same as those in the first embodiment shown in FIG. 1, but the electrode 10a is arranged at an end of the magnetic nanowire 4, and a writing unit 5 including the electrode 2 and the electrode 8 is arranged to be close to the electrode 10a. As a result, the write operation is performed at the end of the magnetic nanowire 4. Incidentally, the electrode 10a can be located at a lower portion of the magnetic nanowire 4 as shown in FIG. 11, but the effect thereof is unchanged if it is located on an upper portion or side portion of the magnetic nanowire 4.

(Read Operation)

Next, the read operation will be described below. A reading unit is located at a portion of the magnetic nanowire 4. There are two ways to locate the reading unit. In the first way, the intermediate layer 2a and the magnetic electrode layer 2b that form the spin transfer torque writing unit are used as a reading unit, and the reading is performed by means of a magnetoresistive effect represented by a tunneling magnetoresistive effect. In this case, if a tunnel barrier material is used to form the intermediate layer 2a, a large signal can be obtained. It is desirable that the direction of the axis of easy magnetization of the magnetic electrode layer 2b in the portion that is in contact with the intermediate layer 2a be the same as the direction of the axis of easy magnetization of the magnetic nanowire 4. By using the first way, a part of the reading unit can be shared by the writing unit, by which it is possible to simplify the device structure.

Figure 12:
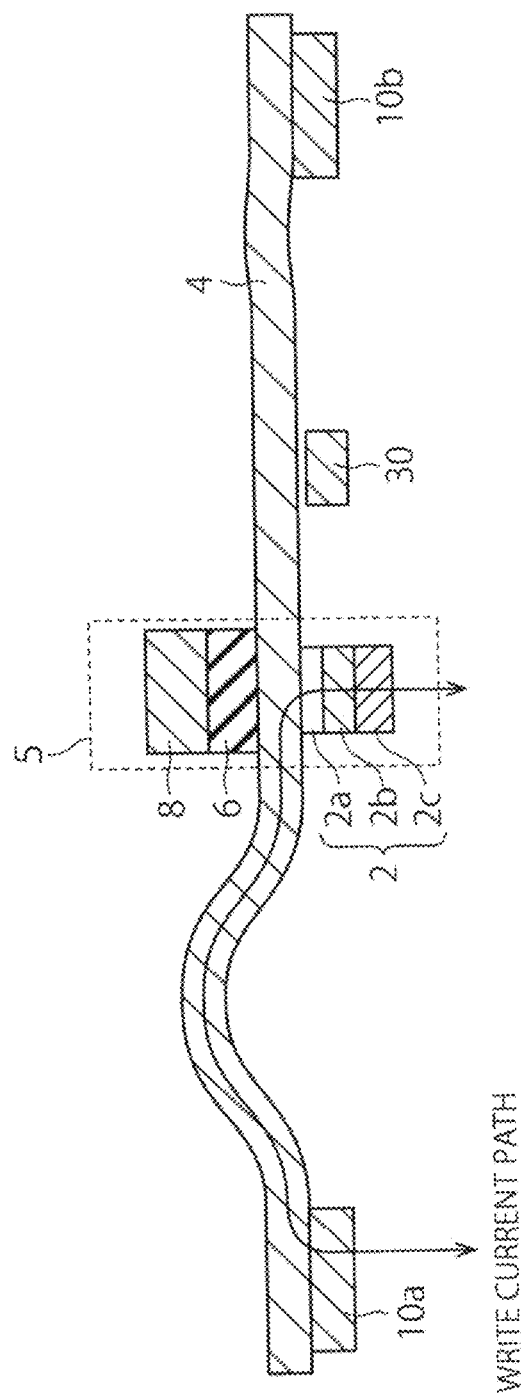
FIG. 12 is a drawing for explaining a second method of a reading operation.
Figure 13:
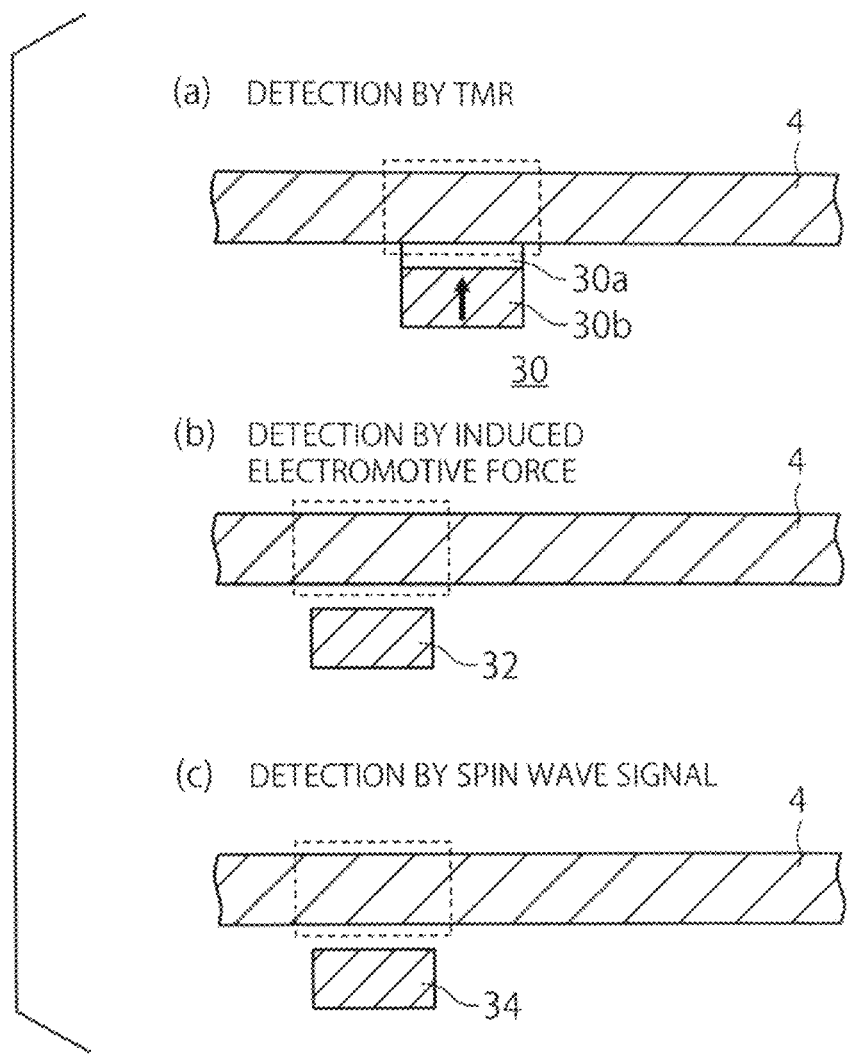
FIGS. 13(a) to 13(c) are drawings for explaining an example of a reading unit.

In the second way, a reading unit 30 is provided separately from the writing unit 5, as shown in FIG. 12. An advantage in the second way is that the read operation does not limit the write operation due to the structural reason. An intermediate layer formed of a metal such as Cu, by which it is possible to cause a large current to flow, is used to form the intermediate layer 2a of the writing unit 5, and a tunnel barrier layer 30a that is in contact with the magnetic nanowire 4 and a magnetic electrode layer 30b are provided to the reading unit 30 as shown in FIG. 13(*a*). In this manner, it is possible to increase the signal output when a read operation is performed with the tunnel barrier being prevented from being broken.

A detection line 32 can be provided to the reading unit 30 so as to be spaced apart from the magnetic nanowire 4 as shown in FIG. 13(*b*), in order to use an induced electromotive force that is generated at the detection line 32 when the magnetic domain wall moves. Alternatively, a spin wave transmission line 34 can be provided so as to be spaced apart from the magnetic nanowire 4 as shown in FIG. 13(*c*) or in contact with the magnetic nanowire 4, so that a spin wave signal can be detected. Furthermore, the detection can be performed by using an anomalous Hall effect, which will be described later. Thus, the detection method is not limited to those using the magnetoresistive effect, but various detection methods can be applied.

As described above, according to the first embodiment, it is possible to provide a magnetic memory having a magnetic nanowire that is capable of reducing the write current when performing a spin transfer torque write operation.

Second Embodiment

Figure 14:
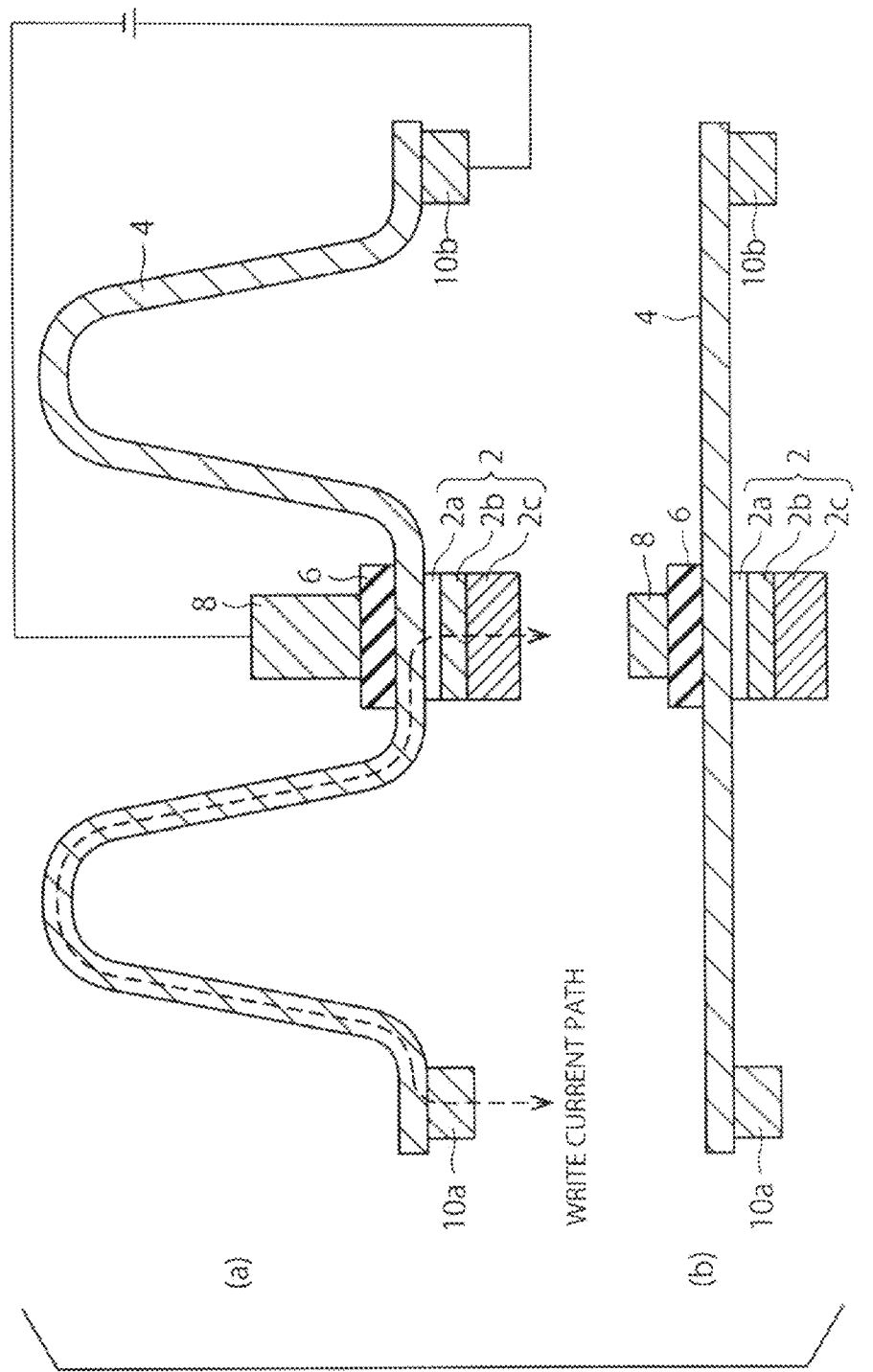
FIGS. 14(a) and 14(b) are drawings for explaining a magnetic memory manufactured by a manufacturing method according to a second embodiment.

Next, a method of manufacturing a magnetic memory according to a second embodiment will be described with reference to FIGS. 14(*a*) to 17(*b*).

The method of manufacturing a magnetic memory according to the second embodiment is a method of manufacturing the magnetic memory according to the first embodiment. For example, a magnetic memory shown in FIG. 14(*a*) or 14(*b*) is manufactured thereby. FIG. 14(*a*) is a cross-sectional view showing a magnetic memory in which the magnetic nanowire 4 has a three dimensional structure having a plurality of bent portions, and FIG. 14(b) is a cross-sectional view showing a magnetic memory in which the magnetic nanowire 4 has a straight shape. Hereinafter, a method of manufacturing a magnetic memory shown in FIG. 14(b) will be described.

Figure 15:
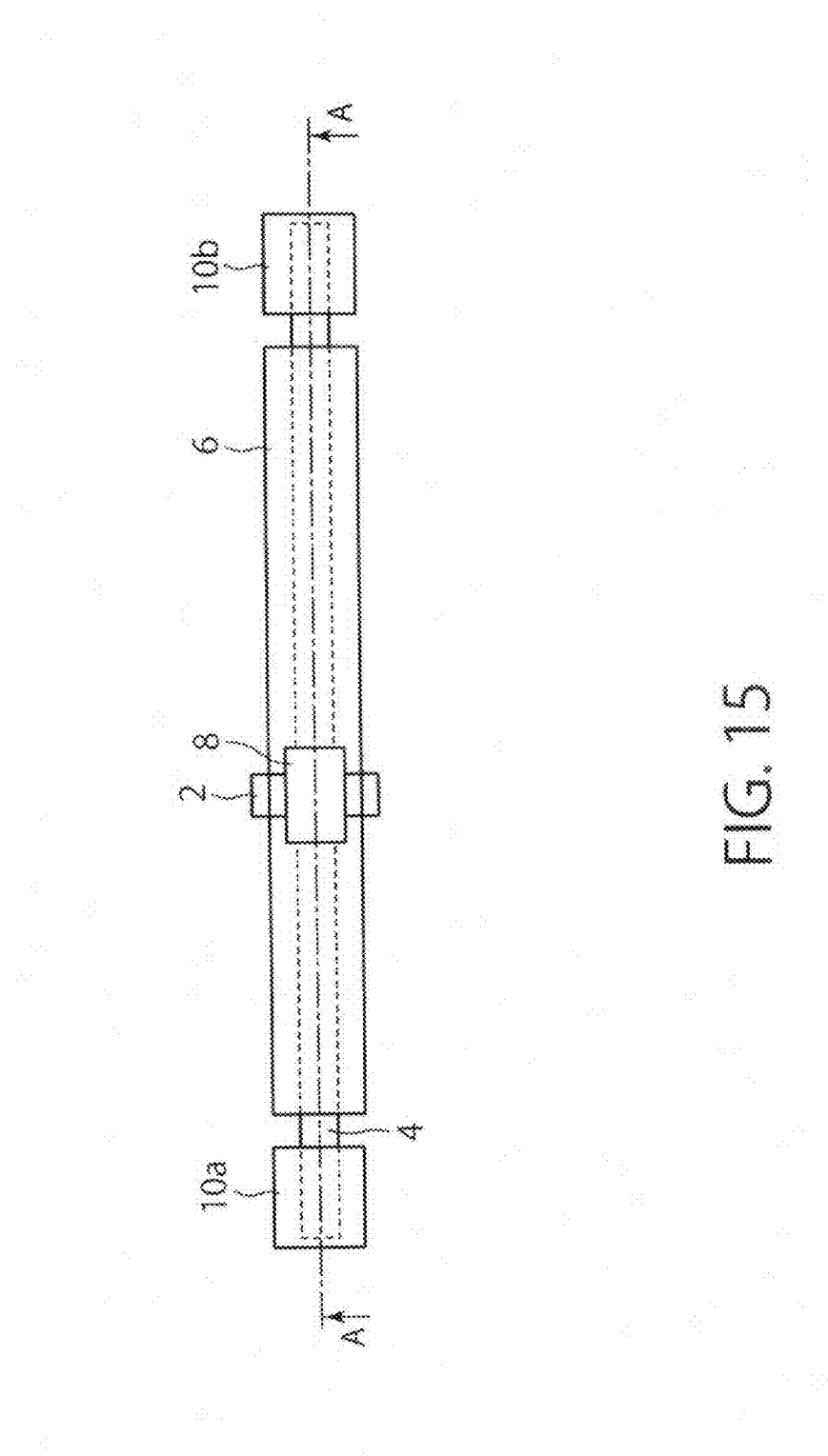
FIG. 15 is a plan view of the magnetic memory manufactured by the manufacturing method according to the second embodiment.
Figure 16:
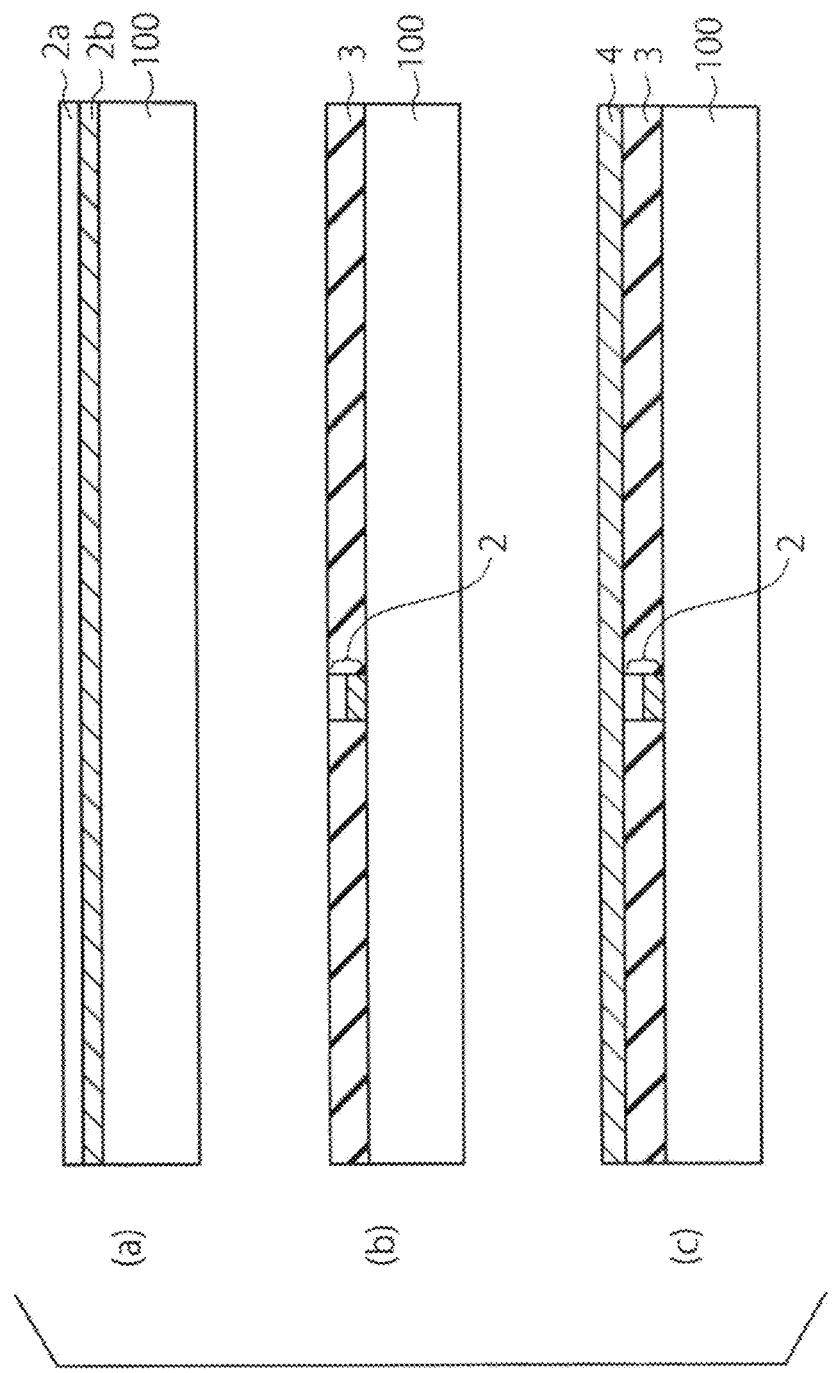
FIGS. 16(a) to 16(c) are cross-sectional views showing the process of the manufacturing method according to the second embodiment.
Figure 17:
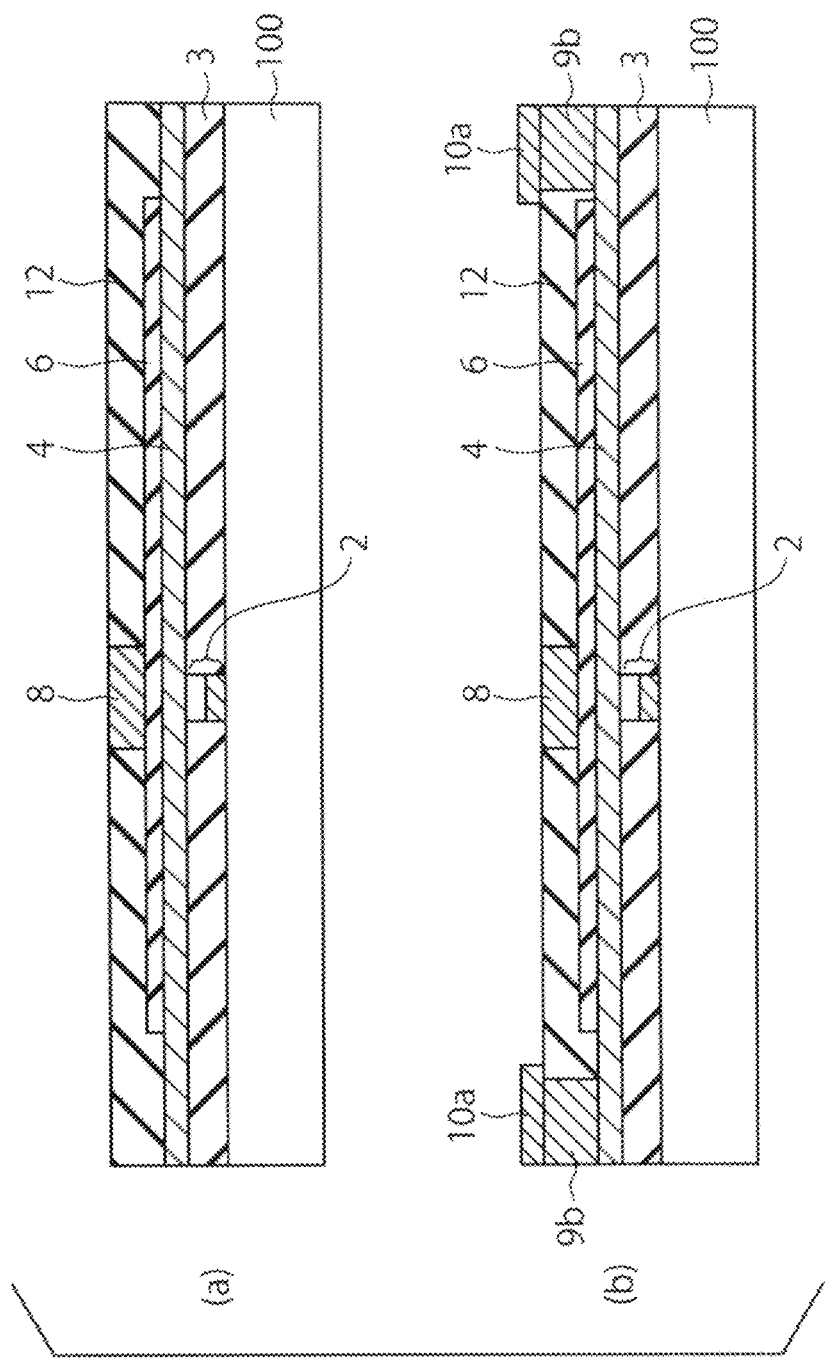
FIGS. 17(a) and 17(b) are cross-sectional views showing the process of the manufacturing method according to the second embodiment.

FIG. 15 is a plan view of a magnetic memory manufactured by a manufacturing method according to the second embodiment. In FIG. 15, the intermediate layer 2a used in the spin transfer torque write operation is a tunnel barrier layer, which is shared by a TMR (Tunnel MagnetoResistance) reading unit. For example, the magnetic nanowire 4 has a width of 20 nm. FIGS. 16(a) to 17(b) are cross-sectional views showing a manufacturing process, taken along line A-A shown in FIG. 15.

First, a Si substrate 100 with a thermally oxidized film, on which a pattern of wirings to form electrodes for read operation and write operation (not shown in FIG. 15) is formed in advance, is arranged within a ultra high vacuum sputtering device. Subsequently, a TbCoFe film having a thickness of 30 nm and a CoFeB film having a thickness of 2 nm are sequentially formed as the magnetic electrode layer 2b corresponding to the TMR fixed layer on the substrate 100 via a buffer layer (not shown in FIG. 15). Furthermore, an insulating layer 2a of MgO having a thickness of 1 nm is formed on the CoFeB film (FIG. 16(a)).

Thereafter, a resist (not shown in FIG. 16(a)) is applied onto the insulating layer 2a, and exposed to light and developed by an electron beam (EB) lithography device, thereby forming a mask of the resist. By performing ion milling using this mask, the magnetic electrode layer 2b and the insulating layer 2a are processed to have a shape of about 2000 nm×20 nm. Subsequently, the surrounding space is filled with an insulating material, for example, SiO$_2$ layer 3, and then, the mask is removed. In this manner, an electrode 2 for both the writing unit and the reading unit is formed (FIG. 16(b)).

Next, the substrate 100 is located within the ultra high vacuum sputtering device again, and a CoFeB film having a thickness of 1 nm and a TbFeCo film having a thickness of 10 nm are sequentially formed to serve as a magnetic nanowire layer 4 (FIG. 16(c)). Subsequently, a resist (not shown in FIG. 16(c)) is applied onto the magnetic nanowire layer 4, and exposed to light and developed by the EB lithography device to have a nanowire shape, thereby forming a nanowire mask. By performing ion milling using this mask, the magnetic nanowire layer 4 is processed to have a nanowire shape. Furthermore, the surrounding space is filled with an insulating material, for example, an SiO$_2$ layer (not shown in FIG. 16(c)). Then, the mask formed on the magnetic nanowire layer 4 is removed, thereby forming the magnetic nanowire 4 (FIG. 16(c)).

Thereafter, a nonmagnetic insulating layer 6 of, for example, HfO is formed. A resist (not shown in the drawings) is applied onto the nonmagnetic insulating layer 6, and exposed to light and developed by the EB lithography device, thereby forming a mask on the nonmagnetic insulating layer 6. Subsequently, the nonmagnetic insulating layer 6 is patterned to have the shape of an electrode by ion milling, and then the mask formed on the nonmagnetic insulating layer 6 is removed. Furthermore, an electrode material layer including a Ta film and an Au film is formed. A resist (not shown in the drawings) is applied onto the electrode material layer, and exposed to light and developed by the EB lithography device, thereby forming a mask. By performing ion milling using this mask, an electrode 8 for applying a electric field to the magnetic nanowire 4 is formed. Thereafter, a nonmagnetic insulating layer 12 is formed, and then the mask formed on the electrode 8 is removed. In this manner, the surrounding of the electrode 8 is filled with a nonmagnetic insulating layer 12 (FIG. 17(a)).

Finally, as shown in FIG. 17(b), current guiding vias 9a, 9b for moving magnetic domain walls are formed toward the magnetic nanowire 4 in the following manner. A resist (not shown in the drawings) is applied onto the nonmagnetic insulating layer 12, and exposed to light and developed by the EB lithography device, thereby forming a mask of the resist having openings at positions where the vias 9a, 9b are to be formed. By performing ion milling on the nonmagnetic insulating layer 12 using this mask, openings reaching the magnetic nanowire 4 are formed in the nonmagnetic insulating layer 12. Thereafter, a metal material film is formed to fill the openings, and smoothed by chemical mechanical polishing (CMP), thereby forming the vias 9a, 9b. Subsequently, an electrode material film is formed and patterned, thereby forming electrodes 10a, 10b connecting to the vias 9a, 9b, respectively.

In this manner, it is possible to manufacture a magnetic memory having the magnetic nanowire 4.

As in the case of the first embodiment, it is possible to provide a magnetic memory including a magnetic nanowire capable of reducing the write current during a spin transfer torque write operation in this second embodiment.

Third Embodiment

A magnetic memory according to a third embodiment will be described with reference to FIGS. 18 to 19(b).

Figure 18:
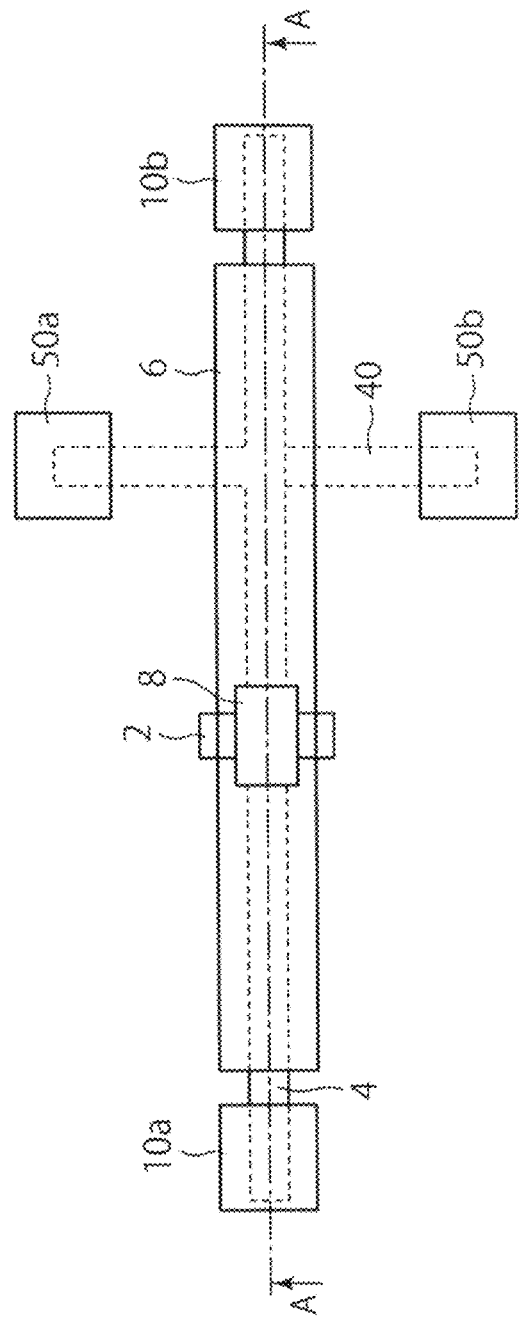
FIG. 18 is a plan view showing a magnetic memory according to a third embodiment.
Figure 19:
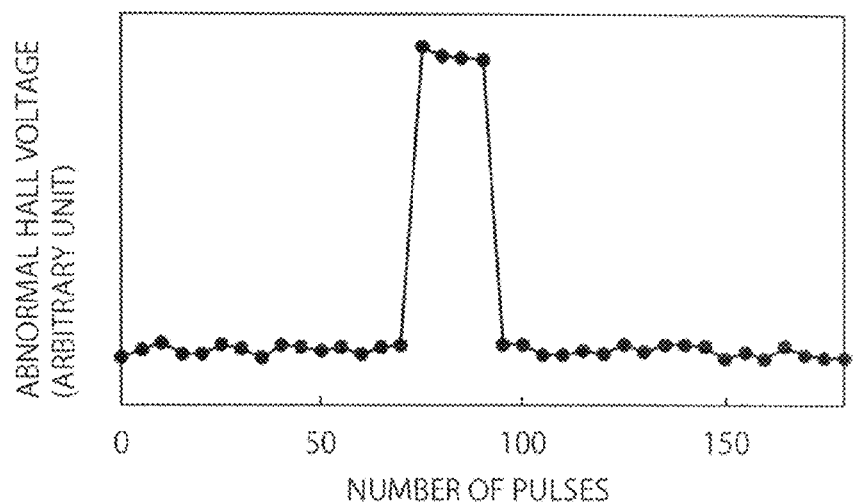
FIGS. 19(a) and 19(b) are drawings for explaining the effect of the magnetic memory according to the third embodiment.
Figure 19:
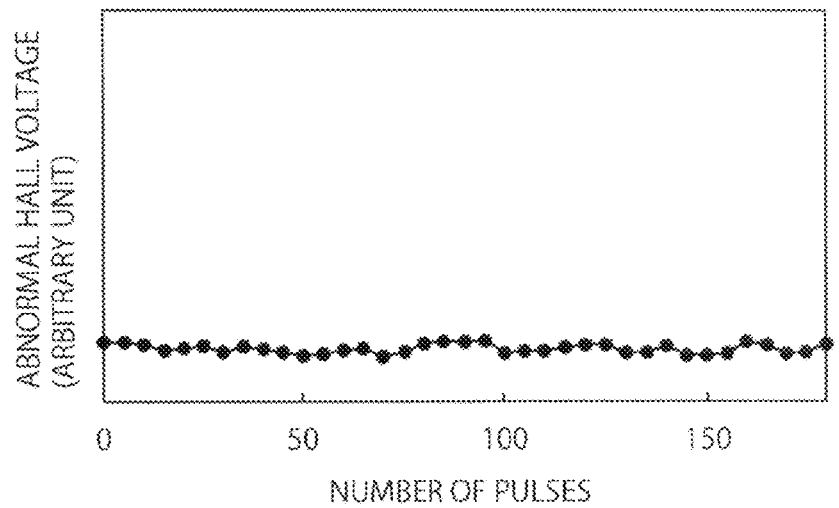

FIG. 18 is a plan view showing a magnetic memory according to the third embodiment. The magnetic memory according to the third embodiment performs the read operation by detecting an anomalous Hall effect in the magnetic memory according to the first embodiment. In order to detect an anomalous Hall effect, a magnetic nanowire 40 extending in the direction perpendicular to the direction along which the magnetic nanowire 4 extends is provided, and electrodes 50a, 50b are provided at both ends of the magnetic nanowire 40.

A magnetic memory according to the third embodiment is manufactured in the same manner as the second embodiment. The width of the magnetic nanowire 40 is 70 nm, the width $W_{NME}$ of the electrode 8 is 100 nm, and the width $W_{FME}$ of the magnetic electrode layer 2a is 70 nm. As a comparative example, another magnetic memory is formed, which is the same as the magnetic memory of the third embodiment except that the electrode 8 is not provided.

Thereafter, a magnetic field is applied to both the magnetic memory according to the third embodiment and the magnetic memory of the comparative example in the direction perpendicular to the film plane so that the direction of magnetization is oriented to the same direction.

Then, in each of the magnetic memory in the third embodiment and the magnetic memory of the comparative example, a current is flowed between the electrode 10a and the electrode 2. Thereafter, a pulse current is flowed between the electrode 10a and the electrode 10b to shift the magnetic domain walls. During this, an anomalous Hall voltage generated between the electrode 50a and the electrode 50b is measured, and whether the write operation is performed or not is evaluated based on whether or not the magnetic domain wall is moved.

Figure 9:
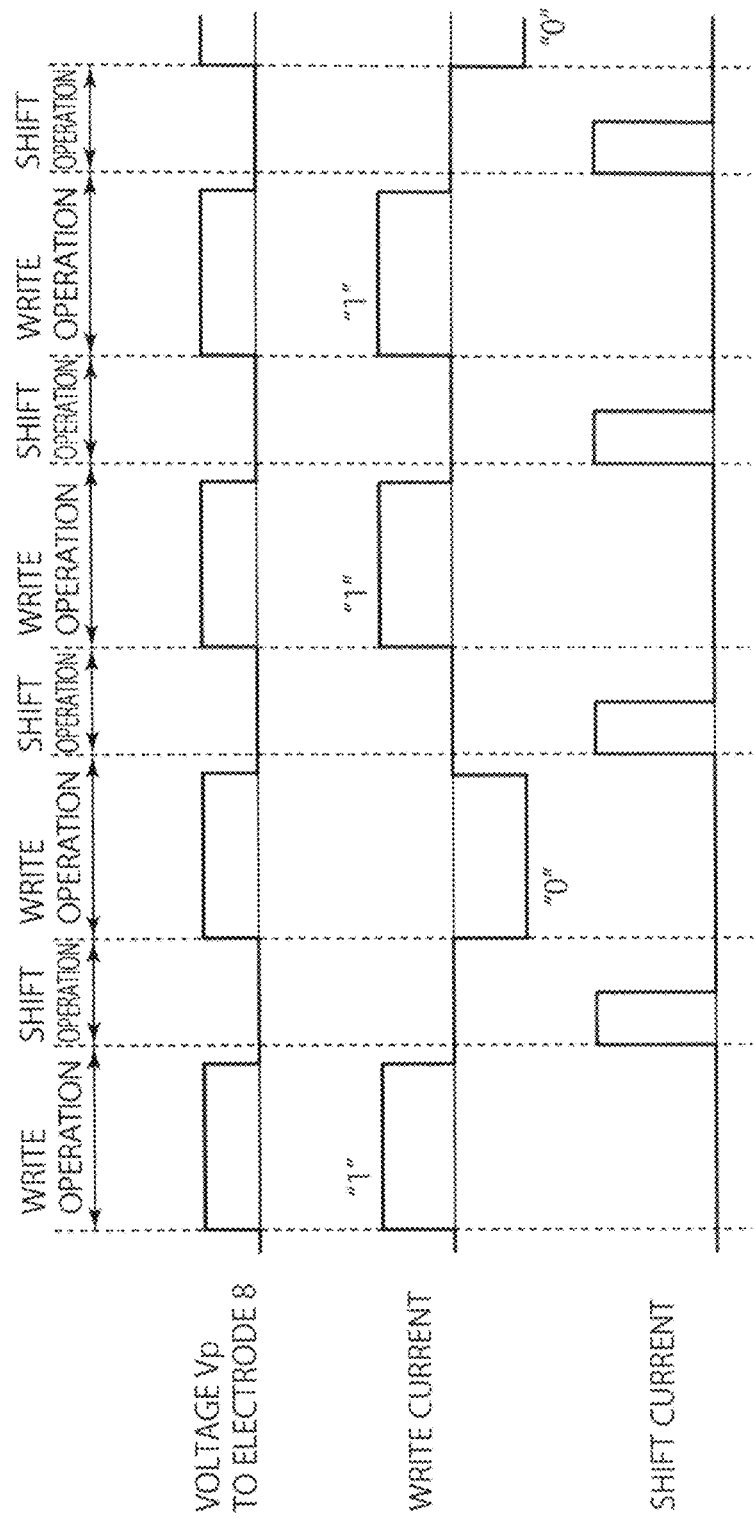
FIG. 9 shows waveforms for explaining a third example of the write operation.

In this embodiment, while a current is flowed between the electrode 10a and the electrode 2, a voltage is applied to the electrode 8 according to the waveforms shown in FIG. 9.

When a current of 0.6 mA is flowed between the electrode 10a and the electrode 10b for 8 ns, the value of anomalous Hall voltage increases at the 75th current pulse and returns to the original value at the 90th pulse in the magnetic memory according to this embodiment, as shown in FIG. 19(a). Thus, writing of bit can be confirmed.

In the comparative example, no change can be observed until the pulse counts 180, as shown in FIG. 19(b).

As can be understood from FIGS. 19(a) and 19(b), the voltage in this embodiment becomes higher than that in the comparative example. However, since no current flows due to this increase in voltage, the power consumption can be ignored. Thus, it is revealed that this embodiment shows a superior low-power characteristic in a write operation.

Example

Next, the effect of the magnetic memories according to the first and third embodiments is checked by micromagnetic simulation.

The electrode 8 is provided to the central portion of the magnetic nanowire 4 having a width of 20 nm, a thickness of 2.5 nm, and a magnetization of 200 emu/cc, with the bit length in the write operation being set to be 48 nm, and the magnetization state at the central portion of the magnetic nanowire 4 is monitored over time.

Figure 20:
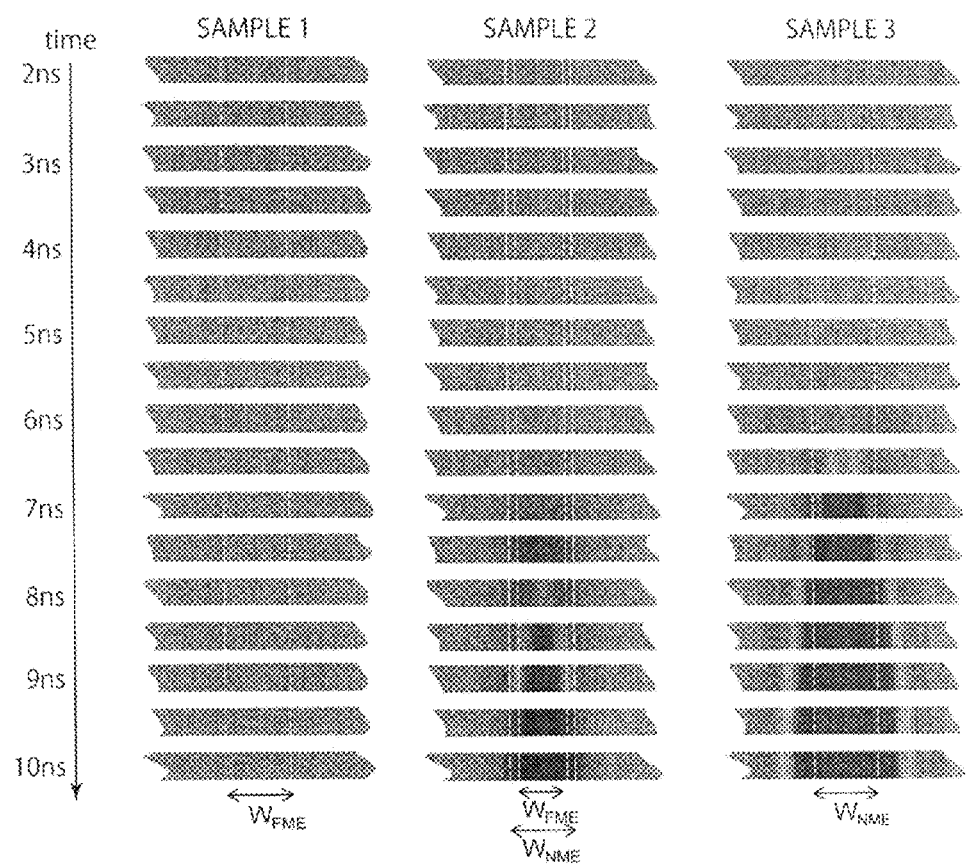
FIG. 20 is a drawing for explaining the effects of the magnetic memories according to the first embodiment and the third embodiment.

As an example of magnetic memory, a magnetic memory is prepared, to which two electrodes 8, 2b are provided, the electrode 8 having a width $W_{NME}$ of 48 nm, and the magnetic electrode layer 2b having a width $W_{FME}$ of 36 nm. The magnetic anisotropy of a portion of the magnetic nanowire 4 corresponding to the electrode 8 having the width $W_{NME}$ is decreased by about 5% using an electric field, and a spin transfer torque is applied to a portion of the magnetic nanowire 4 corresponding to the magnetic electrode 2b having the width $W_{FME}$ (Sample 2). As two comparative examples 1 and 2, two samples are prepared in which the width $W_{FME}$ of the magnetic electrode layer 2b is 48 nm, and a spin transfer torque is applied thereto (Sample 1, Sample 3). FIG. 20 shows the change with time of the magnetization from the time when the current for applying the spin transfer torque starts to flow. Through Sample 1 and Sample 2, the same current of 28.8 μA flows. The write operation cannot be completed after 10 ns in Sample 1 (Comparative Example 1). However, in Sample 2 (Example), a bit is written at around 9 ns. Thus, it is confirmed that the first embodiment has an effect of lowering current. In Sample 3 (Comparative Example 2), the write current is 38.4 μA. If the write current is increased, the write operation can be performed with Comparative Example 2. However, in Comparative Example 2, the length of written bit changes with the lapse of time.

In contrast, in Sample 2, which corresponds to the embodiments of the present application, the length of written bit is stable. Thus, the embodiments are capable of performing writing with a low current, and the state of the bit written in the write operation shows a preferable characteristic as a memory device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   a magnetic nanowire;
   a first electrode and a second electrode provided to different locations of the magnetic nanowire;
   a third electrode including a magnetic layer, the third electrode being provided to a location of the magnetic nanowire between the first electrode and the second electrode;
   an intermediate layer provided between the magnetic nanowire and the third electrode, the intermediate layer being in contact with the magnetic nanowire and the third electrode;
   a fourth electrode of a nonmagnetic material provided onto the magnetic nanowire and being on the opposite side of the magnetic wire from the third electrode; and
   an insulating layer provided between the magnetic nanowire and the fourth electrode, the insulating layer being in contact with the magnetic nanowire and the fourth electrode.

2. The magnetic memory according to claim 1, wherein a width of the fourth electrode on a plane where the fourth electrode is in contact with the insulating layer in a direction along which the magnetic nanowire extends is equal to or more than a width of the third electrode on a plane where the third electrode is in contact with the intermediate layer in the direction along which the magnetic nanowire extends, and less than 400 nm.

3. The magnetic memory according to claim 1, wherein the magnetic nanowire includes constrictions at regular intervals, and a width of the fourth electrode on a plane where the fourth electrode is in contact with the insulating layer in the direction along which the magnetic nanowire extends is equal to or more than a width of the third electrode on a plane where the third electrode is in contact with the intermediate layer in the direction along which the magnetic nanowire extends, and less than two times an interval between adjacent constrictions.

4. The magnetic memory according to claim 1, wherein:
   the magnetic nanowire has a magnetic property in which a magnetic domain wall potential changes periodically; and
   a width of the fourth electrode on a plane where the fourth electrode is in contact with the insulating layer in the direction along which the magnetic nanowire extends is equal to or more than a width of the third electrode on a plane where the third electrode is in contact with the intermediate layer in the direction along which the magnetic nanowire extends, and less than two times a cycle of the magnetic domain wall potential.

5. The magnetic memory according to claim 1, wherein:
   the magnetic nanowire includes constrictions at regular intervals, one recording bit corresponding to two intervals of the constrictions; and
   a width of the fourth electrode on a plane where the fourth electrode is in contact with the insulating layer in the direction along which the magnetic nanowire extends is equal to or more than a width of the third electrode on a plane where the third electrode is in contact with the intermediate layer in the direction along which the magnetic nanowire extends, and less than three times an interval of adjacent constrictions.

6. The magnetic memory according to claim 1, wherein:
   the magnetic nanowire has a magnetic property in which a magnetic domain wall potential changes periodically, one recording bit corresponding to two cycles of the magnetic domain wall potential; and a width of the fourth electrode on a plane where the fourth electrode is in contact with the insulating layer in the direction along which the magnetic nanowire extends is equal to or more than the width of the third electrode on a plane where the third electrode is in contact with the intermediate layer in the direction along which the magnetic nanowire extends, and less than three times a cycle of the magnetic domain wall potential.

7. The magnetic memory according to claim 1, wherein a width of the fourth electrode on a plane where the fourth electrode is in contact with the insulating layer in the direction along which the magnetic nanowire extends is equal to or more than a width of the third electrode on a plane where the third electrode is in contact with the intermediate layer in the direction along which the magnetic nanowire extends, and less than two times a length of a recording bit.

8. The magnetic memory according to claim 1, wherein a width of the fourth electrode in a direction perpendicular to the direction along which the magnetic nanowire extends is more than a maximum width of the magnetic nanowire in a portion corresponding to the fourth electrode.

9. The magnetic memory according to claim 1, wherein a width of the third electrode on a plane where the third electrode is in contact with the intermediate layer in the direction along which the magnetic nanowire extends is equal to or more than a width of a magnetic domain wall of the magnetic nanowire, and equal to or less than a width of the fourth electrode on a plane where the fourth electrode is in contact with the insulating layer in the direction along which the magnetic nanowire extends.

10. The magnetic memory according to claim 1, wherein the intermediate layer is a tunnel barrier layer, and a thickness of the intermediate layer is less than a thickness of the insulating layer.

11. The magnetic memory according to claim 1, wherein the intermediate layer is a nonmagnetic metal layer.

12. The magnetic memory according to claim 1, further comprising a reading unit provided in the vicinity of the magnetic nanowire.

13. The magnetic memory according to claim 1, wherein when a first plane where the fourth electrode and the insulating layer are in contact with each other and a second plane where the third electrode and the intermediate layer are in contact with each other are projected from a direction along which the magnetic nanowire extends, the first plane convers the second plane.

14. The magnetic memory according to claim 1, wherein a length of a portion in which a first plane where the fourth electrode and the insulating layer are in contact with each other and a second plane where the third electrode and the intermediate layer are in contact with each other overlap in the direction along which the magnetic nanowire extends is equal to or more than a width of a magnetic domain wall of the magnetic nanowire, and equal to or less than a width of the third electrode on the second plane in the direction along which the magnetic nanowire extends.

15. The magnetic memory according to claim 1, wherein the magnetic nanowire has an axis of easy magnetization in a thickness direction of the magnetic nanowire.

16. The magnetic memory according to claim 1, wherein the magnetic nanowire has an axis of easy magnetization in a width direction perpendicular to a thickness direction and an extending direction of the magnetic nanowire.

17. The magnetic memory according to claim 1, wherein the third electrode has an axis of easy magnetization parallel to an axis of easy magnetization of the magnetic nanowire.

18. The magnetic memory according to claim 10, wherein the intermediate layer is formed of at least one of AlOx, AlN, MgO, MgN, $SiO_2$, SiN, SiON, $TiO_2$, and $Cr_2O_3$.

19. The magnetic memory according to claim 11, wherein the intermediate layer is formed of graphite.

20. The magnetic memory according to claim 11, wherein the intermediate layer is formed of a metal containing at least one of Cu, Ag, Au, and Al.

21. The magnetic memory according to claim 1, wherein the insulating layer is formed of one of AlOx, AlN, MgO, MgN, $SiO_2$, SiN, SiON, $TiO_2$, $Cr_2O_3$, $BaTiO_3$, $SrTiO_3$, $PbTiO_3$, and $HfO_2$.

22. A write method in the magnetic memory according to claim 1, comprising:
 applying a voltage to the fourth electrode; and
 flowing a write current between the third electrode and one of the first electrode and the second electrode via the magnetic nanowire,
 wherein a time during which the write current is flowed overlaps with a time during which the voltage is applied.

* * * * *